(12) United States Patent
Widmer et al.

(10) Patent No.: US 10,566,839 B2
(45) Date of Patent: Feb. 18, 2020

(54) SYSTEMS, METHODS AND APPARATUS FOR GUIDANCE AND ALIGNMENT BETWEEN ELECTRIC VEHICLES AND WIRELESS CHARGING SYSTEMS

(71) Applicant: WiTricity Corporation, Watertown, MA (US)

(72) Inventors: Hans Peter Widmer, Wohlenschwil (CH); Lukas Sieber, Olten (CH); Andreas Daetwyler, Unterentfelden (CH)

(73) Assignee: WiTricinity Corporation, Watertown, MA (US)

( * ) Notice: Subject to any disclaimer, the term of this patent is extended or adjusted under 35 U.S.C. 154(b) by 499 days.

(21) Appl. No.: 15/069,716

(22) Filed: Mar. 14, 2016

(65) Prior Publication Data
US 2017/0005523 A1   Jan. 5, 2017

Related U.S. Application Data

(60) Provisional application No. 62/186,851, filed on Jun. 30, 2015.

(51) Int. Cl.
*H02J 50/12* (2016.01)
*H02J 50/90* (2016.01)
(Continued)

(52) U.S. Cl.
CPC ............ *H02J 50/12* (2016.02); *B60L 53/12* (2019.02); *B60L 53/36* (2019.02); *B60L 53/38* (2019.02);
(Continued)

(58) Field of Classification Search
CPC ............... B60L 11/182; B60L 11/1829; B60L 11/1833; G01R 33/0206; H02J 50/12;
(Continued)

(56) References Cited

U.S. PATENT DOCUMENTS

| | | | |
|---|---|---|---|
| 7,825,543 B2 | 11/2010 | Karalis et al. | |
| 2012/0001497 A1* | 1/2012 | Sada | H02J 5/005 307/104 |

(Continued)

FOREIGN PATENT DOCUMENTS

| | | |
|---|---|---|
| DE | 102013227129 A1 | 6/2015 |
| GB | 2431301 A | 4/2007 |

(Continued)

OTHER PUBLICATIONS

International Search Report and Written Opinion—PCT/US2016/034412—ISA/EPO—dated Jul. 29, 2016.

(Continued)

*Primary Examiner* — Thienvu V Tran
*Assistant Examiner* — Brian K Baxter
(74) *Attorney, Agent, or Firm* — Knobbe, Martens, Olson & Bear, LLP

(57) ABSTRACT

An apparatus for determining a relative position of a wireless power transmitter from a wireless power receiver is provided. The apparatus comprises a driver circuit configured to generate a first signal and a second signal. At least one of the first signal and the second signal oscillates at two frequencies. The apparatus comprises a first generator coil configured to generate a first alternating magnetic field when driven by the first signal. The first generator coil is also configurable to wirelessly transfer charging power from the wireless power transmitter. The apparatus comprises a second generator coil configured to generate a second alternating magnetic field when driven by the second signal.

22 Claims, 23 Drawing Sheets

(51) Int. Cl.
    *G01R 33/02*     (2006.01)
    *B60L 53/12*     (2019.01)
    *B60L 53/38*     (2019.01)
    *B60L 53/36*     (2019.01)
    *H02J 50/60*     (2016.01)
    *H02J 7/02*     (2016.01)
    *G08G 1/042*     (2006.01)
    *H01F 38/14*     (2006.01)

(52) U.S. Cl.
    CPC .......... *G01R 33/0206* (2013.01); *H02J 7/025* (2013.01); *H02J 50/60* (2016.02); *H02J 50/90* (2016.02); *G08G 1/042* (2013.01); *H01F 38/14* (2013.01); *H01F 2038/143* (2013.01); *Y02T 10/7005* (2013.01); *Y02T 10/7072* (2013.01); *Y02T 90/12* (2013.01); *Y02T 90/121* (2013.01); *Y02T 90/122* (2013.01); *Y02T 90/125* (2013.01); *Y02T 90/14* (2013.01)

(58) Field of Classification Search
    CPC .. H02J 50/60; H02J 50/90; H02J 7/025; H02J 5/005; H02J 17/00; G08G 1/042; H01F 2038/143; H01F 38/14; Y02T 10/7005; Y02T 10/7072; Y02T 90/12; Y02T 90/121; Y02T 90/122; Y02T 90/125; Y02T 90/14
    USPC ......................................................... 307/104
    See application file for complete search history.

(56) References Cited

U.S. PATENT DOCUMENTS

| | | |
|---|---|---|
| 2012/0153739 A1 | 6/2012 | Cooper et al. |
| 2013/0043734 A1* | 2/2013 | Stone .................. H04B 5/0037 307/104 |
| 2013/0288600 A1 | 10/2013 | Kuusilinna et al. |
| 2014/0103730 A1* | 4/2014 | Irie ...................... H04B 5/0037 307/104 |
| 2014/0172338 A1* | 6/2014 | Lafontaine ............ G01R 25/00 702/65 |
| 2015/0015419 A1 | 1/2015 | Halker et al. |
| 2015/0042171 A1* | 2/2015 | Kohara .................. H02J 7/025 307/104 |
| 2015/0151641 A1 | 6/2015 | Berger et al. |
| 2015/0180286 A1* | 6/2015 | Asanuma ............... G01B 7/003 307/104 |
| 2015/0318710 A1* | 11/2015 | Lee ..................... H04B 5/0093 307/104 |
| 2016/0028248 A1 | 1/2016 | Asanuma et al. |
| 2016/0164303 A1* | 6/2016 | Ku ......................... H02J 5/005 307/104 |
| 2016/0318413 A1 | 11/2016 | Roehrl et al. |

FOREIGN PATENT DOCUMENTS

| | | |
|---|---|---|
| WO | WO-2008050260 A1 | 5/2008 |
| WO | WO-2015015690 A1 | 2/2015 |

OTHER PUBLICATIONS

Bhattacharya S., et al., "Design of Static Wireless Charging Coils for Integration into Electric Vehicle," IEEE Third International Conference on Sustainable Energy Technologies (ICSET), 2012, URL: http://www.researchgate.net/publication/260554195,pp. 146-151.

* cited by examiner

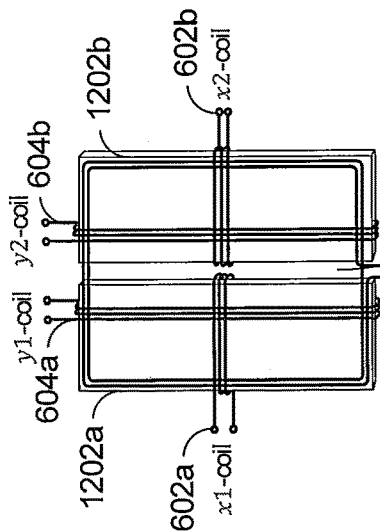
FIG. 13C
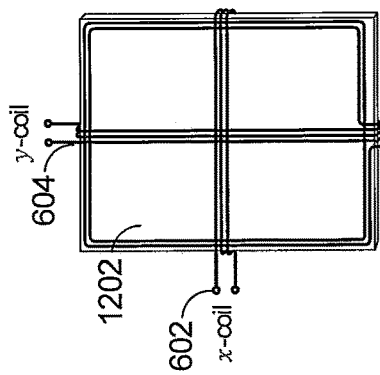
FIG. 13B
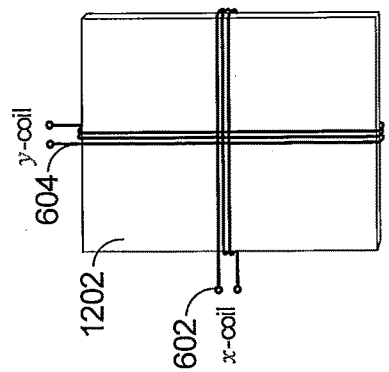
FIG. 13A
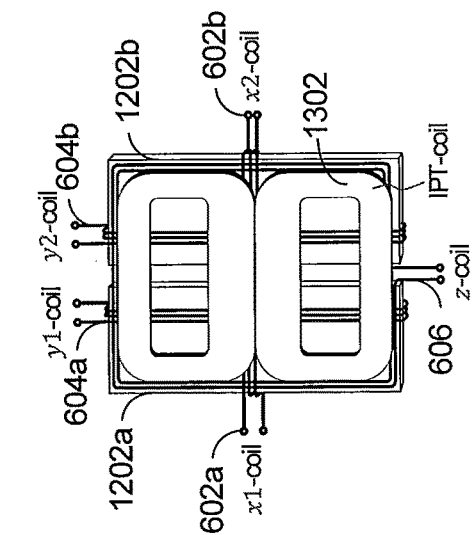
FIG. 13G
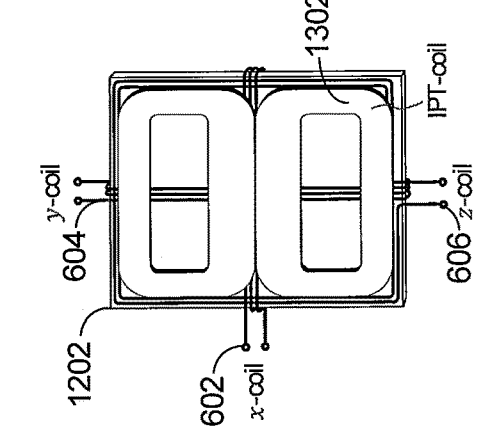
FIG. 13F
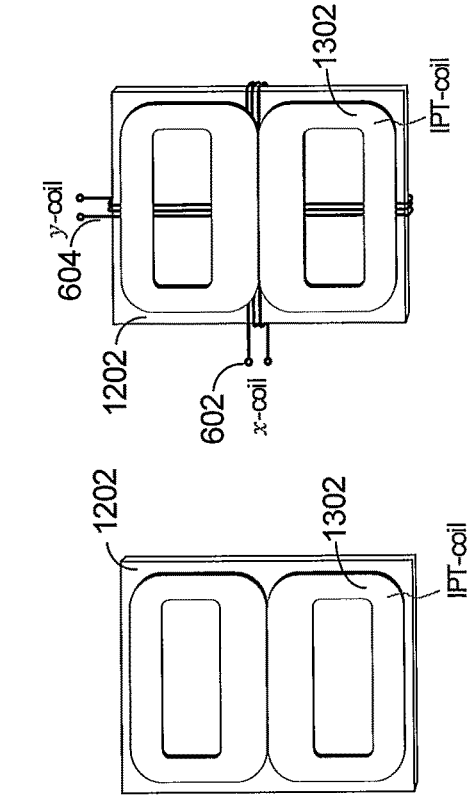
FIG. 13E
FIG. 13D

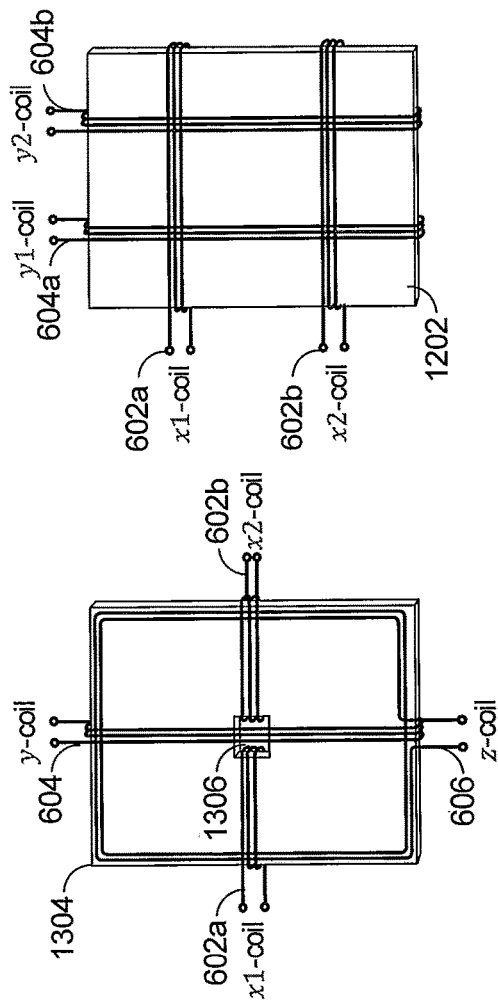
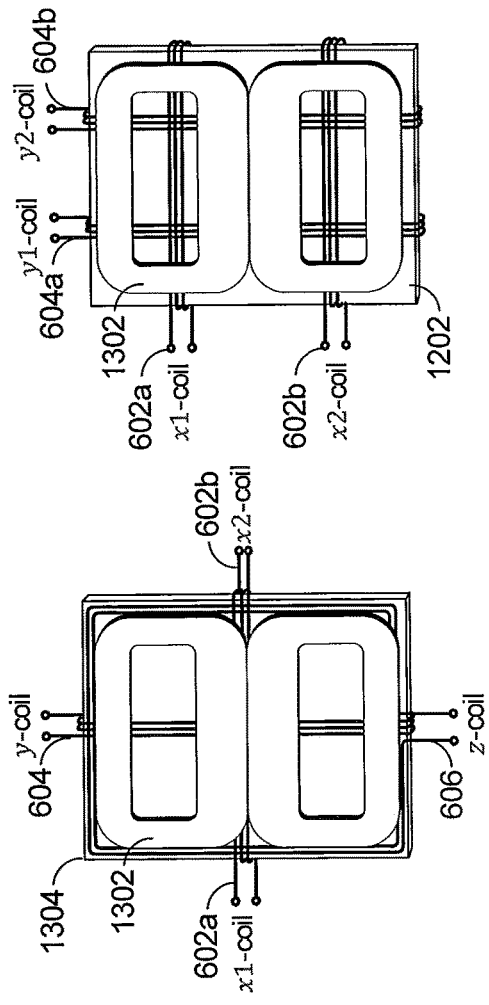
FIG. 13H
FIG. 13I
FIG. 13J
FIG. 13K

SYSTEMS, METHODS AND APPARATUS FOR GUIDANCE AND ALIGNMENT BETWEEN ELECTRIC VEHICLES AND WIRELESS CHARGING SYSTEMS

CROSS REFERENCE TO RELATED APPLICATIONS

This application claims priority to and the benefit under 35 U.S.C. § 119(e) of U.S. Provisional Patent Application No. 62/186,851 entitled "SYSTEMS, METHODS AND APPARATUSES FOR GUIDANCE AND ALIGNMENT BETWEEN ELECTRIC VEHICLES AND WIRELESS CHARGING SYSTEMS" filed on Jun. 30, 2015, the disclosure of which is hereby incorporated by reference in its entirety.

FIELD

This application is generally related to wireless charging power transfer applications, and specifically to systems, methods and apparatuses for guidance and alignment between electric vehicles and wireless inductive charging power systems.

BACKGROUND

Efficiency in wireless inductive charging power applications depends at least in part on achieving at least a minimum alignment threshold between a wireless power transmitter and a wireless power receiver. One method for aiding such alignment is the use of magnetic vectoring, where a distance and/or direction between the wireless power transmitter and the wireless power receiver is determined based on sensing one or more attributes of a magnetic field generated at or near either the wireless power transmitter or the wireless power receiver (the magnetic field may not be for wireless power transfer but for guidance and alignment purposes). However, determining a non-ambiguous position between a wireless power transmitter and a wireless power receiver utilizing magnetic vectoring requires some form of synchronization of the magnetic field detection system with the magnetic field generating system. Accordingly, systems, methods and apparatuses for guidance and alignment between electric vehicles and wireless inductive charging power systems as described herein are desirable.

SUMMARY

An apparatus for determining a relative position of a wireless power transmitter from a wireless power receiver is provided. The apparatus comprises a driver circuit configured to generate a first signal and a second signal. At least one of the first signal and the second signal oscillate at two frequencies. The apparatus comprises a first generator coil configured to generate a first alternating magnetic field when driven by the first signal. The first generator coil is also configurable to wirelessly transfer charging power from the wireless power transmitter. The apparatus comprises a second generator coil configured to generate a second alternating magnetic field when driven by the second signal.

A method for determining a relative position of a wireless power transmitter from a wireless power receiver is provided. The method comprises generating a first signal and a second signal. At least one of the first signal and the second signal oscillate at two frequencies. The method comprises generating a first alternating magnetic field by driving a first generator coil with the first signal. The first generator coil is also configurable to wirelessly transfer charging power from the wireless power transmitter. The method comprises generating a second alternating magnetic field by driving a second generator coil with the second signal.

A non-transitory, computer-readable medium comprising code is provided. The code, when executed, causes an apparatus for determining a relative position of a wireless power transmitter from a wireless power receiver to generate a first signal and a second signal. At least one of the first signal and the second signal oscillates at two frequencies. The code, when executed, causes the apparatus to generate a first alternating magnetic field by driving a first generator coil with the first signal. The first generator coil is also configurable to wirelessly transfer charging power from the wireless power transmitter. The code, when executed, causes the apparatus to generate a second alternating magnetic field by driving a second generator coil with the second signal.

An apparatus for determining a relative position of a wireless power transmitter from a wireless power receiver is provided. The apparatus comprises means for generating a first signal and a second signal. At least one of the first signal and the second signal oscillates at two frequencies. The apparatus comprises means for generating a first alternating magnetic field when driven by the first signal, the means for generating the first alternating magnetic field is also configurable to wirelessly transfer charging power from the wireless power transmitter. The apparatus comprises means for generating a second alternating magnetic field when driven by the second signal.

An apparatus for determining a relative position of a wireless power transmitter from a wireless power receiver is provided. The apparatus comprises a plurality of magnetic sense coils, each configured to generate a respective voltage signal under influence of a first alternating magnetic field and a second alternating magnetic field. At least one of the first alternating magnetic field and the second alternating magnetic field oscillates at two frequencies. The apparatus further comprises a processor configured to determine the relative position of the wireless power transmitter from the wireless power receiver based on the respective voltage signal from each of the plurality of magnetic sense coils.

A method for determining a relative position of a wireless power transmitter from a wireless power receiver is provided. The method comprises generating a respective voltage signal by each of a plurality of magnetic sense coils under influence of a first alternating magnetic field and a second alternating magnetic field. At least one of the first alternating magnetic field and the second alternating magnetic field oscillates at two frequencies. The method comprises determining the relative position of the wireless power transmitter from the wireless power receiver based on the respective voltage signal from each of the plurality of magnetic sense coils.

A non-transitory, computer-readable medium comprising code is provided. The code, when executed, causes an apparatus for determining a relative position of a wireless power transmitter from a wireless power receiver to generate a respective voltage signal by each of a plurality of magnetic sense coils under influence of a first alternating magnetic field and a second alternating magnetic field. At least one of the first alternating magnetic field and the second alternating magnetic field oscillates at two frequencies. The code, when executed, further causes the apparatus to determine the relative position of the wireless power transmitter from the wireless power receiver based on the respective voltage signal from each of the plurality of magnetic sense coils.

An apparatus for determining a relative position of a wireless power transmitter from a wireless power receiver is provided. The apparatus comprises a plurality of means for generating a respective voltage signal under influence of a first alternating magnetic field and a second alternating magnetic field. At least one of the first alternating magnetic field and the second alternating magnetic field oscillates at two frequencies. The apparatus further comprises means for determining the relative position of the wireless power transmitter from the wireless power receiver based on the respective voltage signal from each of the plurality of means for generating the respective voltage signals.

BRIEF DESCRIPTION OF THE DRAWINGS

FIG. 13A is a schematic view of an orthogonal coil arrangement for a 2-axis generator or sensor, in accordance with some implementations.

FIG. 13B is a schematic view of an orthogonal coil arrangement for a 3-axis generator or sensor, in accordance with some implementations.

FIG. 13C is a schematic view of an orthogonal coil arrangement for a 3-axis generator or sensor using two coils in the x-axis and two coils in the y-axis, in accordance with some implementations.

FIG. 13D is a schematic view of a coil arrangement for inductive power transfer, in accordance with some implementations.

FIG. 13E is a schematic view of the coil arrangement of FIG. 13A further including an IPT coil arrangement, in accordance with some implementations.

FIG. 13F is a schematic view of the coil arrangement of FIG. 13B further including an IPT coil arrangement, in accordance with some implementations.

FIG. 13G is a schematic view of the coil arrangement of FIG. 13C further including an IPT coil arrangement, in accordance with some implementations.

FIG. 13H is a schematic view of an orthogonal coil arrangement for a 3-axis generator or sensor using two coplanar x-coils, a single y-coil and a single z-coil, in accordance with some implementations.

FIG. 13I is a schematic view of the coil arrangement of FIG. 13H further including an IPT coil arrangement, in accordance with some implementations.

FIG. 13J is a schematic view of an orthogonal coil arrangement for a 2-axis generator or sensor using two coplanar x-coils, and two coplanar y-coils, in accordance with some implementations.

FIG. 13K is a schematic view of the coil arrangement of FIG. 13J further including an IPT coil arrangement, in accordance with some implementations.

DETAILED DESCRIPTION

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured, or coupled by a "receive coupler" to achieve power transfer.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
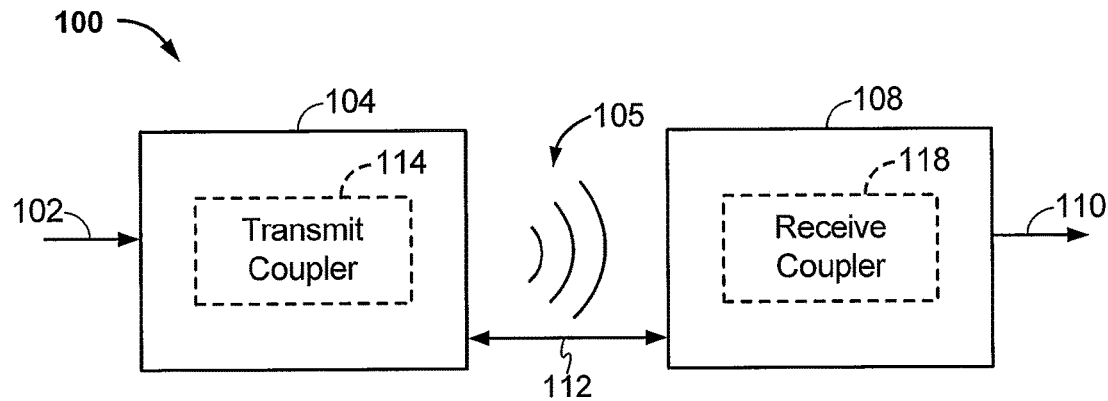
FIG. 1 is a functional block diagram of a wireless power transfer system, in accordance with some implementations.

FIG. 1 is a functional block diagram of a wireless power transfer system 100, in accordance with some implementations. Input power 102 may be provided to a transmitter 104 from a power source (not shown) to generate a wireless (e.g., magnetic or electromagnetic) field 105 via a transmit coupler 114 for performing energy transfer. The receiver 108 may receive power when the receiver 108 is located in the wireless field 105 produced by the transmitter 104. The wireless field 105 corresponds to a region where energy output by the transmitter 104 may be captured by the receiver 108. A receiver 108 may couple to the wireless field 105 and generate output power 110 for storing or consumption by a device (not shown in this figure) coupled to the output power 110. Both the transmitter 104 and the receiver 108 are separated by a distance 112.

In one example implementation, power is transferred inductively via a time-varying magnetic field generated by the transmit coupler 114. The transmitter 104 and the receiver 108 may further be configured according to a mutual resonant relationship. When the resonant frequency of the receiver 108 and the resonant frequency of the transmitter 104 are substantially the same or very close, transmission losses between the transmitter 104 and the receiver 108 are minimal. However, even when resonance between the transmitter 104 and receiver 108 are not matched, energy may be transferred, although the efficiency may be reduced. For example, the efficiency may be less when resonance is not matched. Transfer of energy occurs by coupling energy from the wireless field 105 of the transmit coupler 114 to the receive coupler 118, residing in the vicinity of the wireless field 105, rather than propagating the energy from the transmit coupler 114 into free space. Resonant inductive coupling techniques may thus allow for improved efficiency and power transfer over various distances and with a variety of inductive coupler configurations.

In some implementations, the wireless field 105 corresponds to the "near-field" of the transmitter 104. The near-field may correspond to a region in which there are strong reactive fields resulting from the currents and charges in the transmit coupler 114 that minimally radiate power away from the transmit coupler 114. The near-field may correspond to a region that is within about one wavelength (or a fraction thereof) of the transmit coupler 114. Efficient energy transfer may occur by coupling a large portion of the energy in the wireless field 105 to the receive coupler 118 rather than propagating most of the energy in an electromagnetic wave to the far field. When positioned within the wireless field 105, a "coupling mode" may be developed between the transmit coupler 114 and the receive coupler 118.

Figure 2:
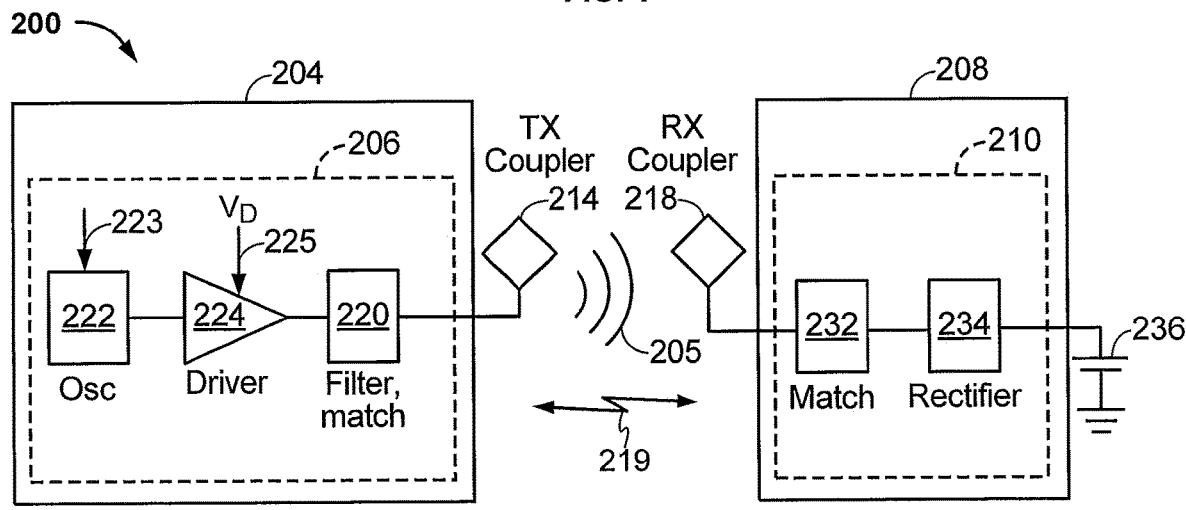
FIG. 2 is a functional block diagram of a wireless power transfer system, in accordance with some other implementations.

FIG. 2 is a functional block diagram of a wireless power transfer system 200, in accordance with some other implementations. The system 200 may be a wireless power transfer system of similar operation and functionality as the system 100 of FIG. 1. However, the system 200 provides additional details regarding the components of the wireless power transfer system 200 as compared to FIG. 1. The system 200 includes a transmitter 204 and a receiver 208. The transmitter 204 includes transmit circuitry 206 that includes an oscillator 222, a driver circuit 224, and a filter and matching circuit 226. The oscillator 222 may be configured to generate a signal at a desired frequency that may be adjusted in response to a frequency control signal 223. The oscillator 222 provides the oscillator signal to the driver circuit 224. The driver circuit 224 may be configured to drive the transmit coupler 214 at a resonant frequency of the transmit coupler 214 based on an input voltage signal ($V_D$) 225.

The filter and matching circuit 226 filters out harmonics or other unwanted frequencies and matches the impedance of the transmit circuitry 206 to the transmit coupler 214. As a result of driving the transmit coupler 214, the transmit coupler 214 generates a wireless field 205 to wirelessly output power at a level sufficient for charging a battery 236.

The receiver 208 comprises receive circuitry 210 that includes a matching circuit 232 and a rectifier circuit 234. The matching circuit 232 may match the impedance of the receive circuitry 210 to the impedance of the receive coupler 218. The rectifier circuit 234 may generate a direct current (DC) power output from an alternate current (AC) power input to charge the battery 236. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205. In some implementations, the receiver 208 may be configured to determine whether an amount of power transmitted by the transmitter 204 and received by the receiver 208 is appropriate for charging the battery 236.

Figure 3:
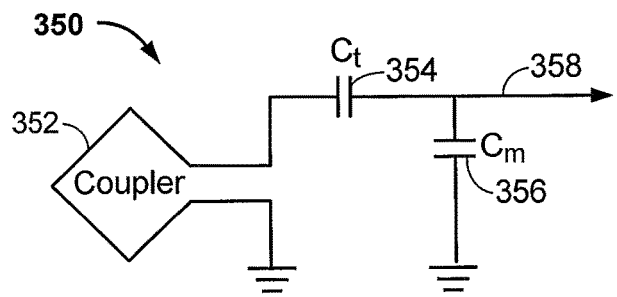
FIG. 3 is a schematic diagram of a portion of transmit circuitry or receive circuitry of FIG. 2 including a transmit or receive coupler, in accordance with some implementations.

FIG. 3 is a schematic diagram of a portion of the transmit circuitry 206 or the receive circuitry 210 of FIG. 2, in accordance with some implementations. As illustrated in FIG. 3, transmit or receive circuitry 350 may include a coupler 352. The coupler 352 may also be referred to or be configured as a "conductor loop", a coil, an inductor, or a "magnetic" coupler. The term "coupler" generally refers to a component that may wirelessly output or receive energy for coupling to another "coupler."

The resonant frequency of the loop or magnetic couplers is based on the inductance and capacitance of the loop or magnetic coupler. Inductance may be simply the inductance created by the coupler 352, whereas, capacitance may be added via a capacitor (or the self-capacitance of the coupler 352) to create a resonant structure at a desired resonant frequency, or at a fixed frequency set or prescribed by a particular operations standard. As a non-limiting example, a capacitor 354 and a capacitor 356 may be added to the transmit or receive circuitry 350 to create a resonant circuit that selects a signal 358 at a resonant frequency. For larger sized couplers using large diameter couplers exhibiting larger inductance, the value of capacitance needed to produce resonance may be lower.

Furthermore, as the size of the coupler increases, coupling efficiency may increase. This is mainly true if the size of both transmit and receive couplers increase. For transmit couplers, the signal 358, oscillating at a frequency that substantially corresponds to the resonant frequency of the coupler 352, may be an input to the coupler 352. In some implementations, the frequency for inductive power transfer may be in the range of 20 kHz to 150 kHz.

In order to maintain a requisite threshold of efficiency and compliance with regulatory standards, inductive charging of electric vehicles in the kilowatt range require relatively tight coupling; the higher the power transfer, the tighter the coupling requirement to maintain EMI levels within compliance of regulatory standards. For example, inductive power transfer (IPT) of 3 kW from a ground-based charging unit to a vehicle-based charging unit over an air gap typically in the range of 70-150 mm may tolerate alignment errors of up to approximately 150 mm, depending on the technology and design of the couplers used. For systems inductively transferring energy at 20 kW, the tolerable alignment error may be less than 50 mm, requiring considerably higher parking precision.

Parking assist systems can potentially help to overcome such alignment issues, thereby increasing convenience and user experience. This is particularly true for position-critical electric vehicle charging. A system that assists a driver in reliably parking an electric vehicle within a so-called "sweet spot" of the coupler system may generally be called a guidance and alignment system. The "sweet spot" may define a zone of alignments between the vehicle-based IPT coupler and a ground-based IPT coupler where coupling efficiency is above a certain minimum value. Such a "sweet spot" may also be defined in terms of emissions, e.g., if the electric vehicle is parked in this "sweet spot," the leakage of the magnetic field, as measured in the area surrounding the vehicle may be below regulatory limits, e.g., ICNIRP limits for electro-motive force (EMF) or electro-magnetic interference (EMI) exposure.

In a minimum solution, the system may simply indicate whether the vehicle has been parked within such a "sweet spot" or not. This may always be needed even in case of an IPT technology that is very tolerant to alignment errors.

A more sophisticated system, which is the subject of this application, determines a position of a vehicle reference point relative to a base reference point. This position data may be translated into visual and/or acoustic guidance and alignment information to assist the driver of the electric vehicle in reliably parking the vehicle within the "sweet spot" of the charging system so as to avoid failed alignment attempts. The driver may use this feedback to correct the trajectory towards the charging spot in real-time and to stop the vehicle within the "sweet spot." Such guidance information may be particularly useful for IPT systems having small alignment tolerances or in conditions that render parking for charging difficult (e.g., by night or snow clad parking lots). In an advanced and yet more sophisticated system, position information may be used to park a vehicle automatically with no or only minimal driver intervention (drive by wire).

Both "guidance" and "alignment" of such an electric vehicle may rely on a local positioning system having components aboard the electric vehicle and components installed in a parking lot (e.g., infrastructure). Systems, devices and methods disclosed herein for positioning are based on generating and sensing a low frequency magnetic field that may be generated either by the base charging unit or by the vehicle charging unit at a frequency preferably below 150 kHz. Such methods, disclosed herein, are referred to as magnetic vectoring and may be used for positioning at a distance range of between 0 and 5 meters from the source of the low frequency magnetic field.

Alignment and particularly guidance may be based at least on determining an accurate position of the vehicle relative to the charging base. There may be several technical approaches to such positioning or localization. These approaches may be based on optical or infrared methods using cameras, appropriate road markings and/or laser scanners, inertial systems using accelerometers and/or gyrometers, measuring propagation time and performing triangulation of acoustic (ultrasonic) waves or electromagnetic waves (e.g., microwaves), and/or sensing a magnetic near-field that may be generated by the base charging unit, vehicle charging unit or by other external devices.

A positioning/localization method should be reliably functional in substantially all conditions as experienced in an automotive environment indoors (no GPS reception) and outdoors, in different seasonal weather conditions (snow, ice, water, foliage), at different day times (sun irradiation, darkness), with signal sources and sensors polluted (dirt, mud, dust, etc.), with different ground properties (asphalt, ferroconcrete), and/or in the presence of vehicles and other reflecting or line-of-sight obstructing objects (e.g., wheels of own vehicle, vehicles parked adjacent, etc.). Moreover, for the sake of minimizing infrastructure installation complexity and costs, methods allowing full integration of all system components into the base charging unit and/or vehicle charging unit and not requiring installation of additional components external to these units (e.g., signal sources, antennas, etc.) are desirable. Considering all of above aspects, sensing a magnetic near field has been found particularly promising for alignment and guidance within a parking stall and in the surrounding area.

A basic method of sensing the magnetic field for purposes of positioning assumes that at least one of a charging base or vehicle generates an alternating magnetic field that can be sensed by a sensor system, which may be either integrated into the vehicle charging unit or built into the charging base, respectively. In some implementations, the frequency of the sensing magnetic field may be substantially the same as the operating frequency of the IPT system. In some other implementations, the frequency of the sensing magnetic field may be different from the IPT frequency, but low enough so that sensing (e.g., positioning) takes place in the so-called near-field (e.g., within $1/2\pi$ or ~15.9% of a wavelength) of the sensing magnetic field. A suitable frequency may be in a low frequency (LF) band (e.g., in the range from 120-140 kHz), however, a frequency in a high frequency (HF) band (e.g., in the 6.78 MHz or 13.56 MHz ISM-band) may also be utilized. In addition, in some implementations, the sense magnetic field may be generated using the same coil or the same coil arrangement that is used for IPT (e.g., the transmit coupler 274 of FIG. 2 or the transmit coupler 352 of FIG. 3). However for higher accuracy and wider applicability, use of one or more separate coils specifically for the purpose of positioning may be advantageous.

In some implementations presenting a simple, low cost solution, only an alignment score representative of the coupling strength between one or more coils generating the sense magnetic field and one or more sense coils receiving the generated sense magnetic field is determined but the system may not be able to provide a driver of the electric vehicle with any more information (e.g., actual alignment error and/or how the driver should correct in case of a failed alignment attempt). In such low complexity solutions, the sense magnetic field may be generated by the one or more primary IPT coils of the base unit and an alignment score is determined by measuring, e.g., the vehicle's secondary coil short circuit current or open circuit voltage using current/voltage transducers that may also be used for controlling and monitoring the IPT system. In such low complexity solutions, primary current of the one or more primary coils required in the alignment mode may be lower than during regular IPT operation. However, the magnetic and/or electric fields generated may still be too high to meet applicable regulatory limits, e.g., a human exposure standard or an OEM-specified limit. This may be particularly true if the alignment mode is activated before the vehicle has fully parked over the one or more primary coils of the charging base.

In some other, more sophisticated implementations, magnetic field sensing may provide position information over an extended range that can be used to assist the driver in accurately parking the vehicle within the "sweet" spot. Such systems may require dedicated active field sensors that are frequency selective and considerably more sensitive than ordinary current or voltage transducers used for wirelessly transferring power. Furthermore, such a system has the potential to operate at lower magnetic and electric field levels that are compliant with human exposure standards in all situations.

Yet other even more sophisticated implementations may provide higher positioning accuracy and wider applicability by utilizing one or more dedicated coils for generating the magnetic field. These generator coils may be arranged and configured for generating a more complex magnetic field pattern that may be utilized to resolve position ambiguity issues, as will be described in more detail below. Sensing the magnetic near field may also apply for positioning outside a parking stall in an extended area, e.g., inside a parking garage. In such implementations, magnetic field sources may be road-embedded, e.g., in the access aisles. Such designs may also be used for dynamic roadway powering and charging systems.

A well-known difficulty of quasi-static magnetic field (near field) positioning techniques based on sensing an alternating (sinusoidal) magnetic field is the requirement for synchronization between magnetic field generator and magnetic field sensor. Absence of any synchronization information leads to a signal polarity (180° phase) ambiguity issue and consequently to position ambiguity. The 180° phase ambiguity is a known problem of the magnetic radio compass, which has been used for radio direction finding, e.g., in nautical and aeronautical navigation systems. It is also a problem in magnetic field-based vehicle positioning systems used for guidance and alignment of an electric vehicle for purposes of inductive charging.

The present application mainly relates to the magnetic vector polarity issue and to methods and systems for achieving the necessary synchronization between magnetic field transmitter and receiver in positioning systems using a multi-axis magnetic field generator and a multi-axis magnetic field sensor. The present application assumes a multi-tone scheme (FDM) to transmit magnetic beacon signals in different axes. The rational behind FDM is low complexity, spectral efficiency, robustness against interference and high dynamic range as needed to cope with the "near-far" effects as typically encountered in magnetic near field transmissions.

The 3-axis or 2-axis generator/3-axis sensor position finding problem of vehicle charging only requires knowledge of the relative signal (vector) polarities and thus relative phase synchronization between tones of an FDM transmission. As opposed to absolute phase, relative phase synchronization can be achieved in-band by either using a narrow-band modulated signal or in a very simple way by using a double tone transmission in at least one of the generator axes.

Preferably, this double tone has a tone separation equal to the frequency separation of tones transmitted in other axes resulting in a FDM transmission scheme with equal spacing between adjacent tone frequencies. In the receiver, these tones and tones emanating from other positioning transmitters may be separated using Fast Fourier Transform Techniques with high side-lobe and thus high cross-talk and adjacent channel attenuation.

FIGS. 4A, 4B, 4C, 4D illustrate different positional relationships between a charging base (e.g., a base pad) 402 and a vehicle charging unit (e.g., a vehicle pad) 404 using one of a ground-based coordinate frame and a vehicle-based coordinate frame. FIGS. 4A, 4B, 4C, 4D assume a magnetic vectoring (MV) field generator and a MV field sensor are integrated with the IPT couplers in the base pad 402 and the vehicle pad 404 of a vehicle 406 in positions such that the magnetic centers of the respective IPT coupler and of the MV generator coincide. Furthermore, FIGS. 4A, 4B, 4C, 4D assume any magnetic field polarization axis of the base IPT coupler and of the vehicle IPT coupler are equally oriented with any of the axes of the MV field generator and MV field sensor, respectively, such that a single coordinate frame from the perspective of each of the MV field generator and the MV field sensor is required to define a positional relationship between a base IPT coupler and a vehicle IPT coupler. Moreover, FIGS. 4A, 4B, 4C, 4D assume that the axis of the ground-based coordinate frame is oriented parallel to the parking stall outline as indicated in FIGS. 4A-4D by a parking stall marking, and that the vehicle-based coordinate frame axis is oriented parallel to the vehicle's symmetry axis.

The above assumptions have been made for the sake of simplicity and clarity and should not be construed as either a requirement or precluding other configurations and arrangements. For example, the coordinate frames of the IPT couplers may differ from the coordinate frames of the MV generator and sensor in position and orientation. The coordinate frames may also differ from any symmetry axis as defined by the parking stall and/or the vehicle geometry. In such implementations, additional positional relationships among the different coordinate frames should be defined.

For FIGS. 4A, 4B, 4C, 4D, the magnetic centers of the IPT couplers may be defined as a first point in the base IPT coupler (e.g., the transmit coupler 214 of FIG. 2) and a second point in the vehicle IPT coupler (e.g., the receive coupler 218 of FIG. 2) where the first point and the second point have essentially zero horizontal offset from one another when IPT coupling is at a maximum for any amount of rotation of the vehicle 406 that is within any constraints dictated by the type of IPT coupler. For "polarized" IPT couplers, this definition for magnetic centers of the IPT couplers may hold for rotations of the vehicle restricted to within ±30° and/or 150°-210°. Normally, the magnetic center of a particular IPT coupler is located approximately on a symmetry axis of the magnetic field generated by that particular IPT coupler.

Likewise, the magnetic centers of the MV field generator and of the MV field sensor may be defined as a first point in the generator and a second point in the sensor where the first point and the second point have essentially zero horizontal offset from one another when the positioning system determines that an essentially zero relative horizontal offset between the first point and the second point has been reached for any azimuthal rotation of the sensor.

As shown in FIGS. 4A, 4B, 4C, 4D, the x-axis and y-axis always refer to the coordinate frame from the perspective of the MV field sensor, while the x'-axis and y'-axis always refer to the coordinate frame from the perspective of the MV field generator. This is true regardless of whether the MV field sensor is located in the base pad (see FIGS. 4C and 4D) or in the vehicle pad (see FIGS. 4A and 4B). The z-axis and the z'-axis, respectively, are not shown in FIGS. 4A, 4B, 4C, 4D but are assumed to point towards the sky (e.g., the zenith), thus defining a "right-handed" or "positive" coordinate system. These coordinate systems will be referenced throughout this application.

Figure 4B:
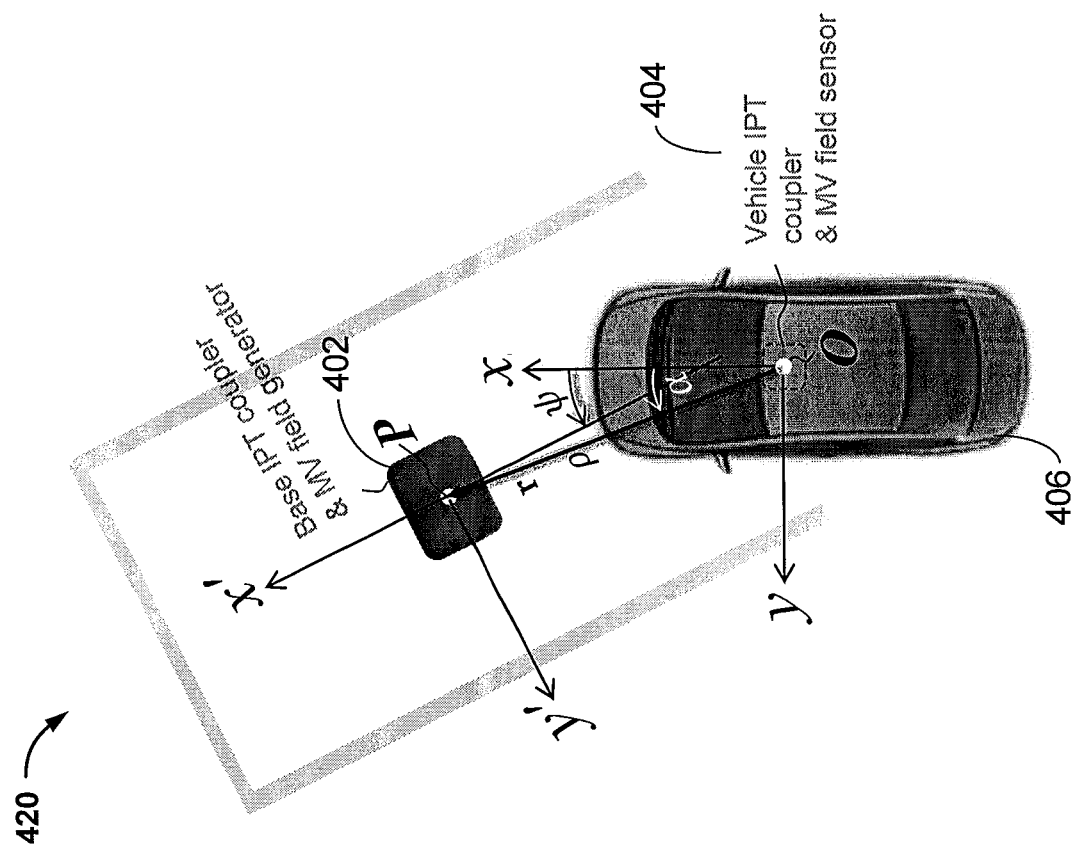
FIG. 4B illustrates a positional relationship between a vehicle-based magnetic field sensor and a ground-based magnetic field generator installed in a parking stall, the generator's position and rotation represented in the sensor's coordinate frame.
Figure 4A:
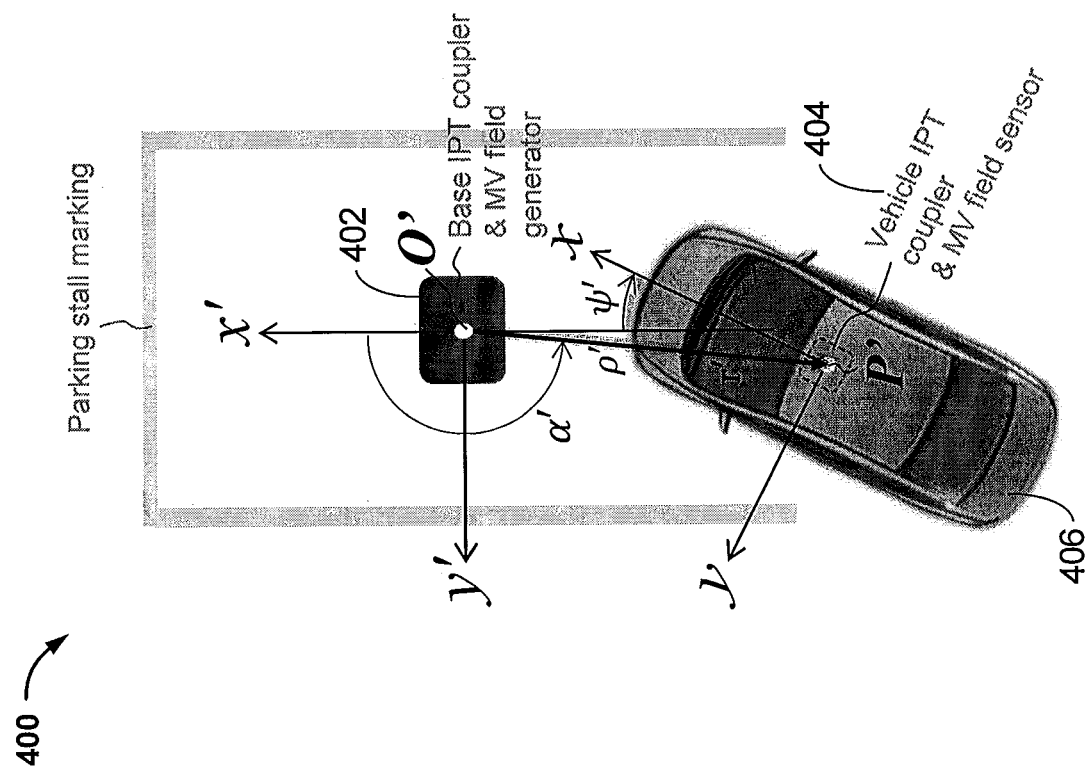
FIG. 4A illustrates a positional relationship between a vehicle-based magnetic field sensor and a ground-based magnetic field generator installed in a parking stall, the sensor's position and rotation represented in the generator's coordinate frame.

FIGS. 4A, 4B illustrate a positional relationship between a ground-based generator and a vehicle-mounted sensor, in accordance with some implementations. In FIG. 4A, position and rotation of the sensor are represented in generator coordinates by a position vector $\vec{r'}=\overrightarrow{O'P'}$ where O' and P' denote the magnetic center points of the generator and sensor, respectively, and where P' is represented in the generator's coordinate frame, having its origin at O'. The rotation of the sensor's coordinate frame with respect to the generator's coordinate frame (e.g., an angle of intersection between the x-axis of the sensor's coordinate frame and the x'-axis of the generator's coordinate frame) is defined by the angle of rotation $\psi'$ measured from the x'-axis. Using polar coordinates, the sensor's position and rotation may be defined by azimuth angle $\alpha'$ measured from the x'-axis, the distance $\rho'$ (length of r'), and $\psi'$, respectively, as defined with respect to the generator's coordinate frame.

In FIG. 4B, position and rotation of the generator are represented in sensor coordinates by a position vector $\vec{r}=\overrightarrow{OP}$ where O and P denote the magnetic center points of the sensor and the generator, respectively, and where P is represented in the sensor's coordinate frame, having its origin at O. The rotation of the generator's coordinate frame with respect to the sensor's coordinate frame (e.g., an angle of intersection between the x'-axis of the generator's coordinate frame and the x-axis of the sensor's coordinate frame) is defined by the angle of rotation $\psi$ measured from the x-axis. Using polar coordinates, the generator's position and rotation may be defined by azimuth angle $\alpha$ measured from the x-axis, the distance $\rho$ (length of r), and $\psi$, respectively, as defined with respect to the sensor's coordinate frame.

Figure 4D:
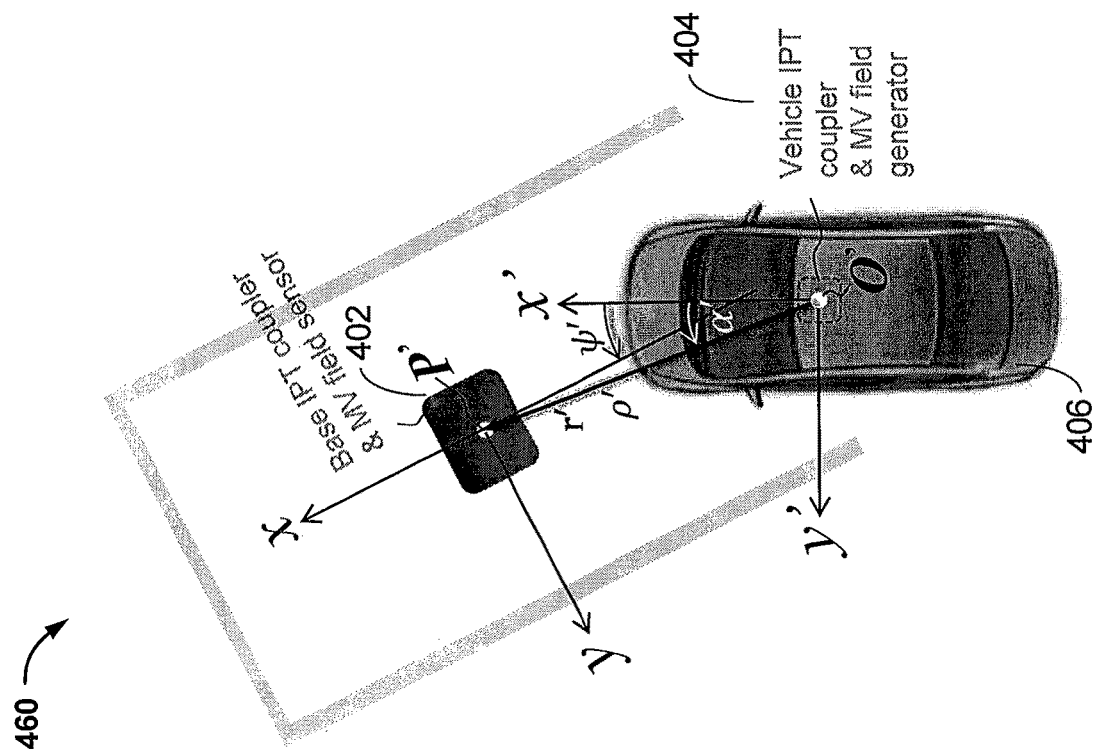
FIG. 4D illustrates a positional relationship between of a vehicle-based magnetic field generator and a ground-based magnetic field sensor installed in a parking stall, the sensor's position and rotation represented in the generator's coordinate frame.
Figure 4C:
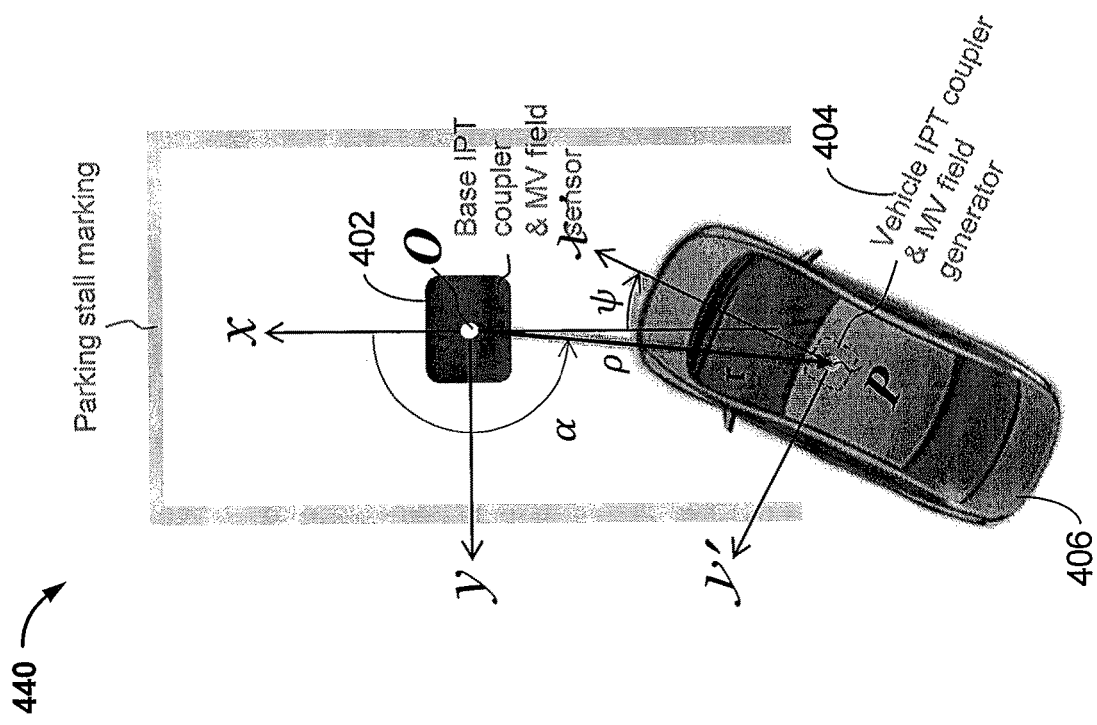
FIG. 4C illustrates a positional relationship between a vehicle-based magnetic field generator and a ground-based magnetic field sensor installed in a parking stall, the generator's position and rotation represented in the sensor's coordinate frame.

FIGS. 4C and 4D illustrate a positional relationship between a vehicle-mounted generator and ground-based sensor, in accordance with some implementations. In FIG. 4C, position and rotation of the generator are represented in sensor coordinates by a position vector r=OP where O and P denote the magnetic center points of sensor and the generator, respectively, and where P is represented in the sensor's coordinate frame, having its origin at O. The rotation of the generator's coordinate frame with respect to the sensor's coordinate frame (e.g., an angle of intersection between the x'-axis of the generator's coordinate frame and the x-axis of the sensor's coordinate frame) is defined by the angle of rotation $\psi$ measured from the x-axis. Using polar coordinates, the generator's position and rotation may be defined by azimuth angle $\alpha$ measured from the x-axis, the distance $\rho$ (length of r), and $\psi$, respectively, as defined with respect to the sensor's coordinate frame.

In FIG. 4D, position and rotation of the sensor are represented in generator coordinates by a position vector $\vec{r'}=\overrightarrow{O'P'}$ where O' and P' denote the magnetic center points of the generator and sensor, respectively, and where P' is represented in the generator's coordinate frame, having its origin at O'. The rotation of the sensor's coordinate frame with respect to the generator's coordinate frame (e.g., an angle of intersection between the x-axis of the sensor's coordinate frame and the x'-axis of the generator's coordinate frame) is defined by the angle of rotation $\psi'$ measured from the x'-axis. Using polar coordinates, the sensor's position and rotation may be defined by azimuth angle $\alpha'$ measured from the x'-axis, the distance $\rho'$ (length of r'), and $\psi'$, respectively, as defined with respect to the generator's coordinate frame.

Figure 5:
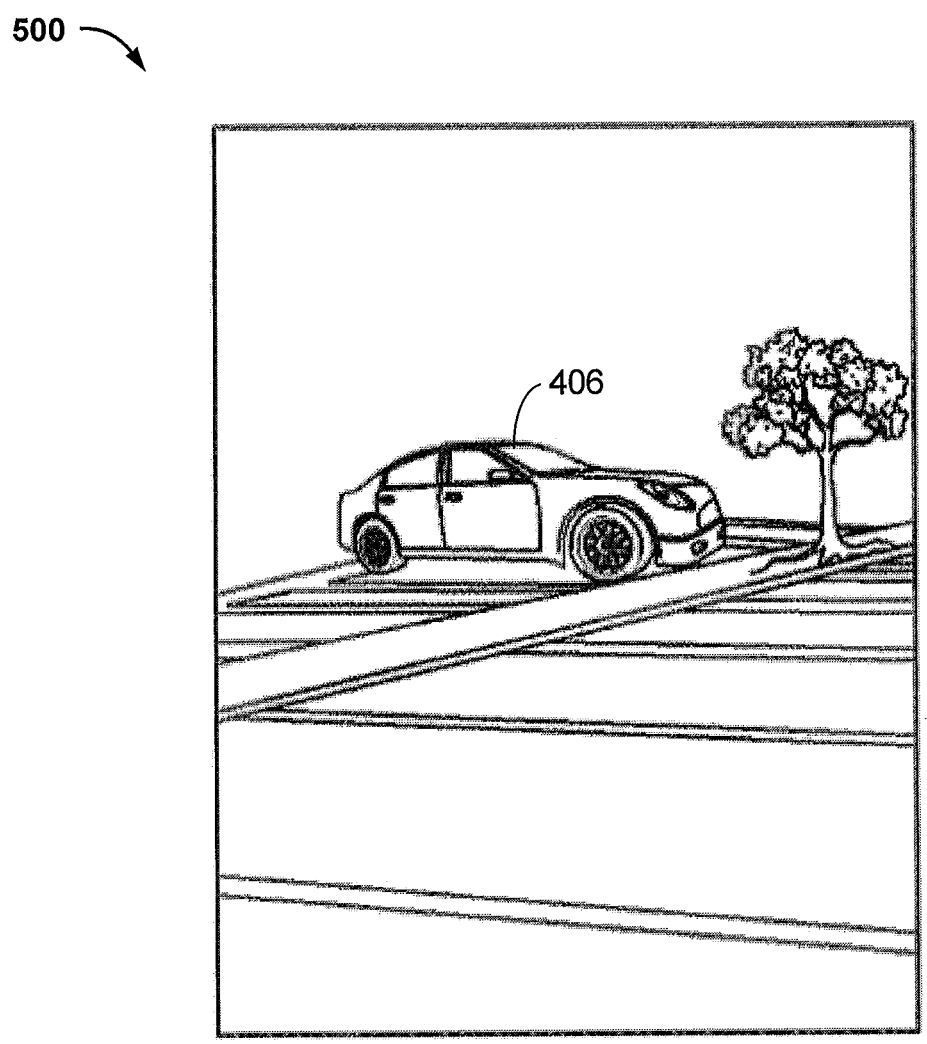
FIG. 5 is an illustration of a vehicle in a parking lot including structures and parking lot markings that can be used for positioning and aligning the vehicle.

In some guidance and alignment implementations, the positional relationship between generator and sensor includes the position vector (e.g., r) but excludes the rotation angle (e.g., $\psi$). This partially defined positional relationship may apply, e.g., in a system where the driver uses other information to align the vehicle 406 to the parking stall frame as required for proper parking, e.g., by using road markings, grass verges, curbstones, etc. as shown in FIG. 5.

In some other guidance and alignment implementations, the positional relationship excludes the parking sense of the vehicle (e.g., forward or reverse parking). This partially defined positional relationship may apply in a system where the parking sense of the vehicle does not matter (e.g., because base and vehicle IPT couplers are center mounted) or, if the parking sense matters, the driver uses other information to park the vehicle in the right sense, e.g., from markings, signs, knowledge of standard installation rules, etc.

Figure 6:
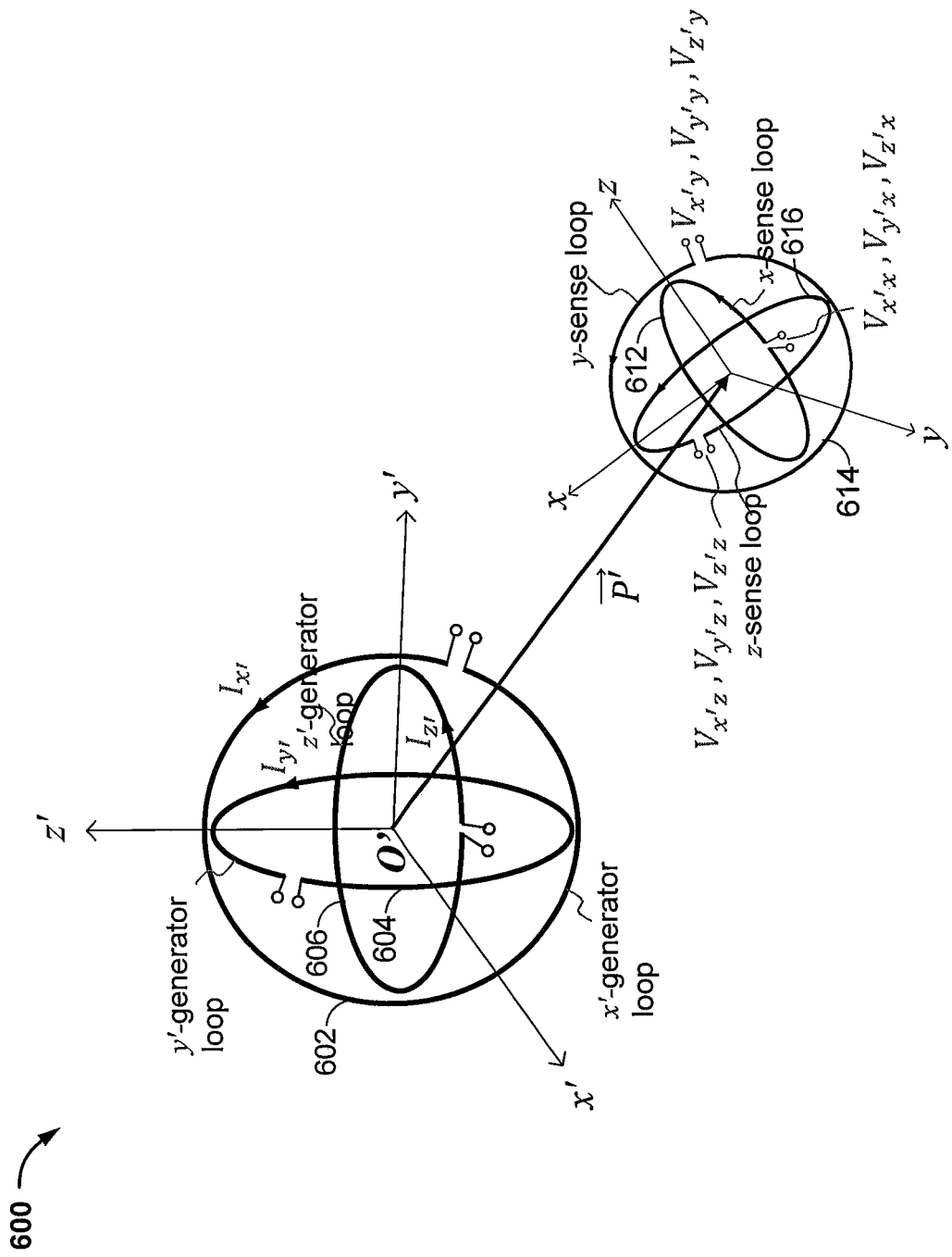
FIG. 6 illustrates a 3-axis magnetic field generator and a 3-axis magnetic field sensor based on orthogonal arrangements of generator coils and sensor coils, in accordance with some implementations.

FIG. 6 illustrates a 3-axis magnetic field generator and a 3-axis magnetic field sensor based on an orthogonal arrangement of generator coils 602, 604, 606 and sense coils 612, 614, 616 in accordance with some implementations. In some implementations, the generator coils 602, 604, 606 may be individually described as a first generator coil 602, a second generator coil 604, and a third generator coil 606. Likewise, in some implementations, the sense coils 612, 614, 616 may be individually described as a first sense coil 612, a second sense coil 614, and a third sense coil 616. The generator coils 602, 604, 606 and sense coils 612, 614, 616 may be multi-turn wire loops or coils with or without a magnetic core. The generator coils 602, 604, 606 are arranged orthogonal to one another and are configured to be driven by respective currents $I_{x'}$, $I_{y'}$ and $I_{z'}$ to generate respective first alternating magnetic field, second alternating magnetic field, and third alternating magnetic field, each having magnetic moments in orthogonal directions, e.g., on a x'-, y'-, and z'-axis of the same generator coordinate frame previously described in connection with FIGS. 4A-4D. The same is true for the sense coils 612, 614, 616. If driven by respective currents, they would generate magnetic moments in orthogonal directions, e.g., on a x-, y-, and z-axis of the sensor's coordinate frame that may be arbitrarily rotated relative to that of the generator, as previously described in connection with FIGS. 4A-4D. In some implementations, the frequencies of oscillation of the currents $I_{x'}$, $I_{y'}$ and $I_{z'}$ may be low enough such that wavelengths of the magnetic fields generated by the generator coils 602, 604, 606 are much larger than a distance separating the generator from the sensor. Moreover, dimensions of the generator coils 602, 604, 606 and the sensor coils 612, 614, 616 in the plane in which each is wound are much smaller than the distance separating the generator from the sensor. However, in operation, magnetic flux from the magnetic fields generated by the generator coils 602, 604, 606 may flow through the sensor coils 612, 614, 616 and generate respective voltages across the terminals of each of the sensor coils 612, 614, 616. For mathematical treatment, these voltage components may be written as a triple of three-dimensional vectors:

$$V_{x'} = \begin{bmatrix} V_{x'x} \\ V_{x'y} \\ V_{x'z} \end{bmatrix}, V_{y'} \begin{bmatrix} V_{y'x} \\ V_{y'y} \\ V_{y'z} \end{bmatrix}, V_{z'} = \begin{bmatrix} V_{z'x} \\ V_{z'y} \\ V_{z'z} \end{bmatrix} \quad (1)$$

where $V_{x'}$, $V_{y'}$, $V_{z'}$ denote the voltage vector produced by the field generated by the x'-, y'-, and z'-generator coils 602, 604, 606, respectively.

The coil currents $I_{x'}$, $I_{y'}$ and $I_{z'}$ generating the three magnetic moments in the x'-, y'-, and z'-direction may be also represented in vector form as:

$$I_{x'} = \begin{bmatrix} I_{x'} \\ 0 \\ 0 \end{bmatrix}, I_{y'} = \begin{bmatrix} 0 \\ I_{y'} \\ 0 \end{bmatrix}, I_{z'} = \begin{bmatrix} 0 \\ 0 \\ I_{z'} \end{bmatrix}. \quad (2)$$

Provided that the currents $I_{x'}$, $I_{y'}$ and $I_{z'}$ generate magnetic moments of equal strength in all three orthogonal directions, Equation (3) may be assumed:

$$I_{x'}=I_{y'}=I_{z'}=I \quad (3)$$

Figure 7A:
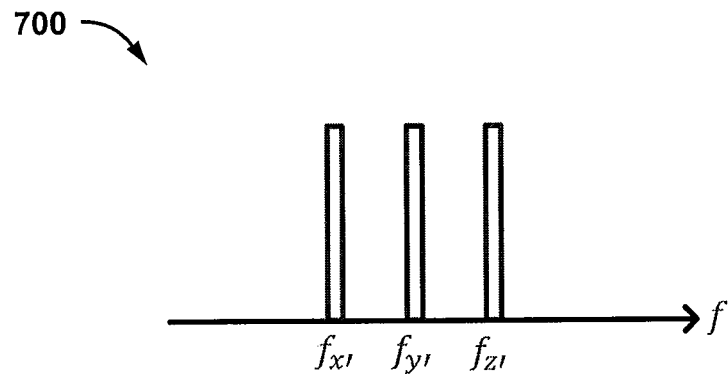
FIG. 7A illustrates a plurality of frequencies for use in frequency-division magnetic field multiplexing, in accordance with some implementations.

FIG. 7A illustrates a plurality of frequencies for use in frequency-division magnetic field multiplexing, in accordance with some implementations. As shown in FIG. 7A, in order to differentiate between the alternating magnetic fields generated by each of the generator coils 602, 604, 606, each of the generator coils 602, 604, 606 may be concurrently driven with currents oscillating at respective frequencies $f_{x'}$, $f_{y'}$ and $f_{z'}$. In some implementations, $f_{x'}$, $f_{y'}$ and $f_{z'}$ may be equally spaced in frequency.

Figure 7B:
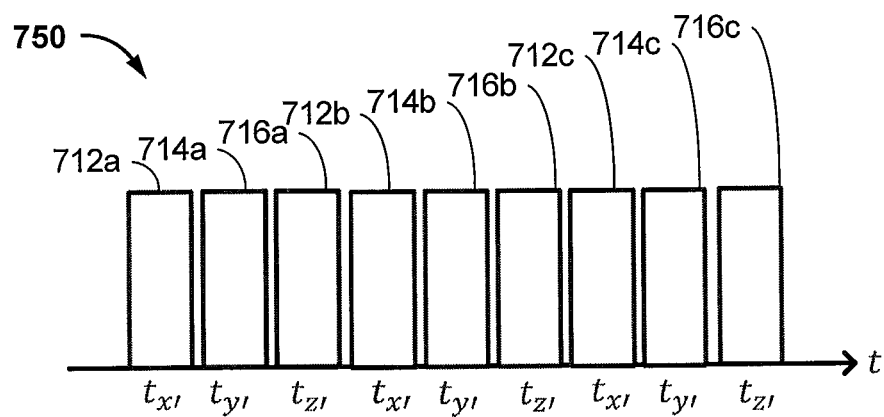
FIG. 7B illustrates a plurality of time slots for use in time-division magnetic field multiplexing, in accordance with some implementations.

FIG. 7B illustrates a plurality of time slots for use in time-division magnetic field multiplexing, in accordance with some implementations. In some implementations, each of the generator coils 602, 604, 606 are driven sequentially, during respective time slots. For example, time slots 712a, 712b, 712c may be time slots during which the generator coil 602 (e.g., x' coil) is driven, time slots 714a, 714b, 714c may be time slots during which the generator coil 604 (e.g., y' coil) is driven, and time slots 716a, 716b, 716c may be time slots during which the generator coil 606 (e.g., z' coil) is driven. In some other implementations, some other multiplexed format may be utilized that allows separation of the voltage components induced into each of the three sense coils 612, 614, 616 (e.g., x, y, and z coils respectively). Other multiplexed formats may use: code division multiplexing (CDM), frequency hopping, swept frequency, orthogonal frequency division multiplexing (OFDM), or the like.

Figure 8:
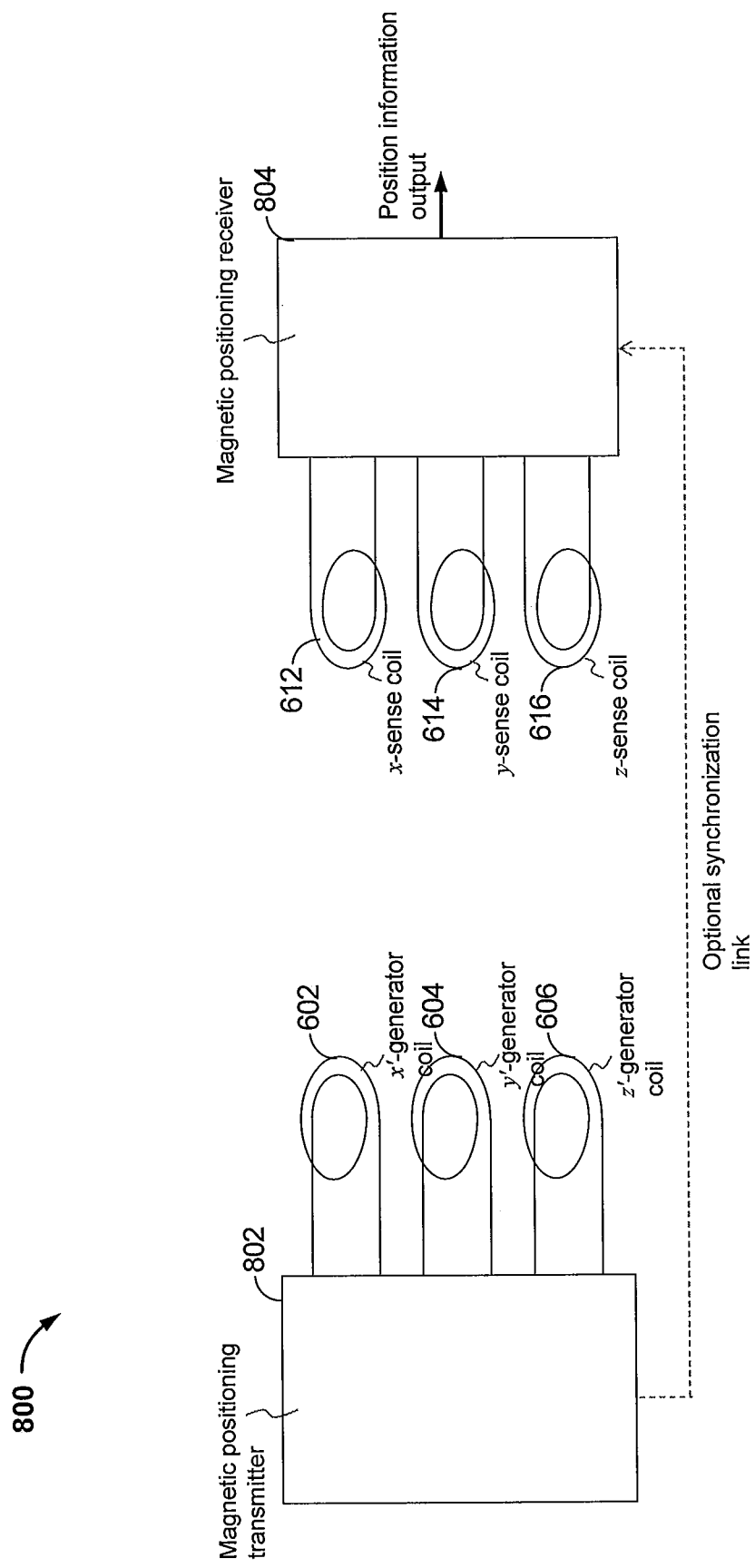
FIG. 8 illustrates a block diagram of a magnetic field position-finding system, in accordance with some implementations.

FIG. 8 illustrates a block diagram of a magnetic field position-finding system 800, in accordance with some implementations. The system 800 comprises a magnetic field positioning transmitter 802 configured to drive each of the generator coils 602, 604, 606 with respective current signals. The system 800 additionally comprises a magnetic field positioning receiver 804 configured to receive a plurality of voltage signals from the sensor coils 612, 614, 616, where the voltage signals are induced in the sense coils 612, 614, 616 by magnetic flux, generated by the generator coils 602, 604, 606 passing though the sense coils 612, 614, 616.

Using a 3-axis generator 802 and a 3-axis sensor 804, as shown in FIG. 8 for example, it is possible to determine a bi-ambiguous position and a non-ambiguous direction to the sensor from the generator's coordinate frame in the full 3D space up to a radius that is limited by the performance characteristics of the system. However, this bi-ambiguity cannot be further resolved using information available in the sensed alternating magnetic fields.

Figure 9:
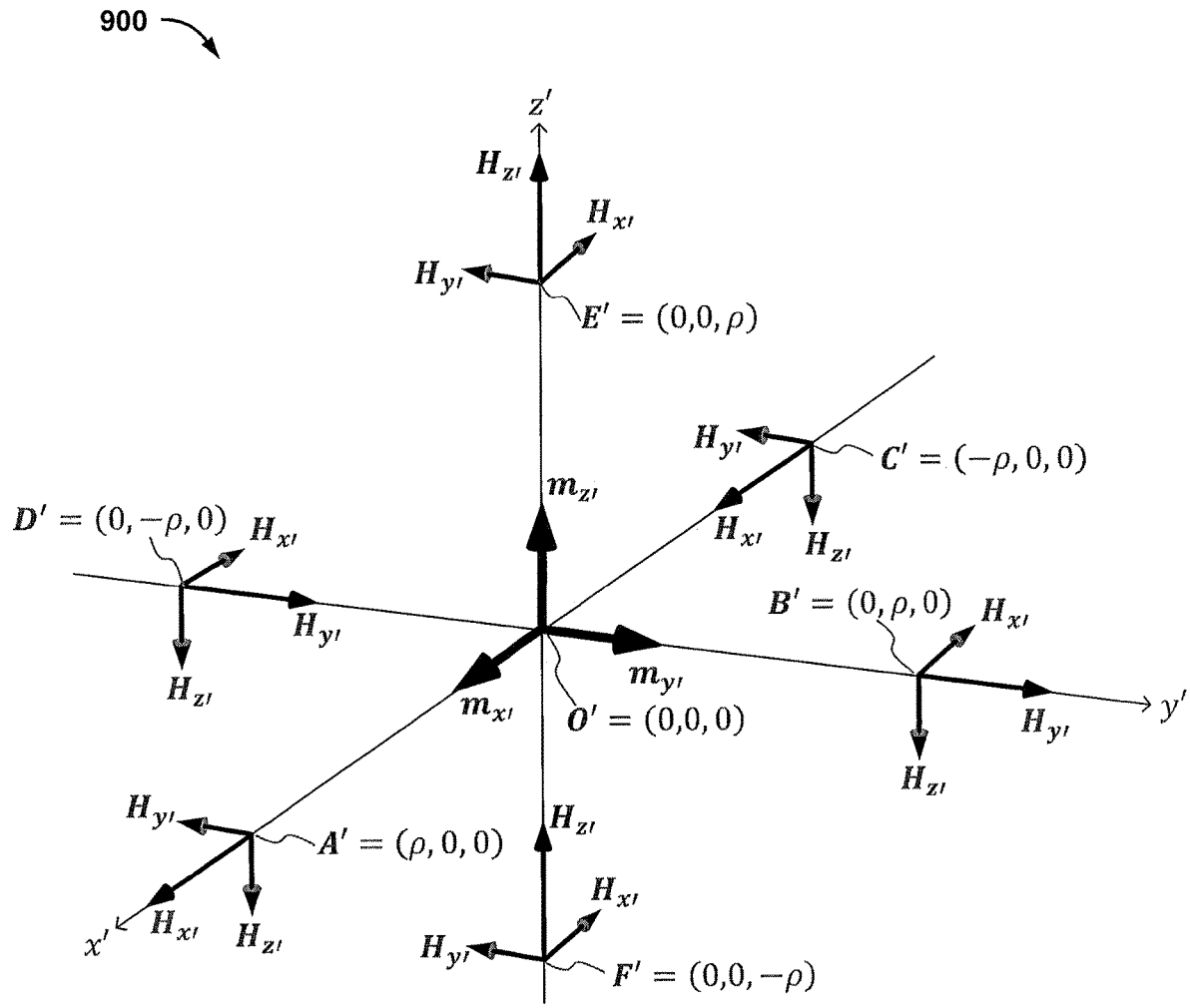
FIG. 9 illustrates magnetic moments of a magnetic field generated by a 3-axis generator and the resulting magnetic field vector triples at each of six different on-axis positions, in accordance with some implementations.

This bi-ambiguity issue is illustrated by example in FIG. 9. FIG. 9 illustrates magnetic moments $m_{x'}$, $m_{y'}$, $m_{z'}$ of a magnetic field generated by a 3-axis generator (e.g., such as that shown in FIG. 8) and the resulting magnetic field vector triples ($H_{x'}$, $H_{y'}$, $H_{z'}$) at each of six different on-axis positions A', B', C', D', E', F', in accordance with some implementations. The magnetic moment vectors $m_{x'}$, $m_{y'}$, $m_{z'}$, are illustrated at the origin of the generator coordinate frame O'=(0,0,0) and the resulting magnetic field vector triples $H_{x'}$, $H_{y'}$, $H_{z'}$, at the six equidistant on-axis points A'=(ρ, 0,0), B'=(0, ρ, 0), C'=(−ρ, 0,0), D'=(0, −ρ, 0), E'=(0,0, ρ), F'=(0,0, −ρ). At each of these six on-axis points, the vector triple consists of a vector in a radial direction (e.g., $H_{x'}$ for point A') resulting from the on-axis moment and two other vectors (e.g., $H_{y'}$, $H_{z'}$ for point A') in directions tangential to the radial directions resulting from the two other magnetic moments pointing in perpendicular directions. It can be seen that an ambiguous position always consists of two diametrically opposed (antipodal) positions, which may be mathematically expressed using position vectors in Equation (4) below:

$$r'_1 = r'_2 \quad (4)$$

It can be shown that Equation (4) is also true for any off-axis position (not shown in FIG. 9). For each antipodal point pair there exists a unique vector triple that may be represented in terms of H-field vectors $H_{x'}$, $H_{y'}$, $H_{z'}$ or in terms of voltage vectors $V_{x'}$, $V_{y'}$, $V_{z'}$ induced in the sense coils 612, 614, 616 assuming the sense coils 612, 614, 616 are orthogonally placed. A vector triple forms a tetrahedron that is defined by six quantities, e.g., the three voltage vector magnitudes, which may be expressed as scalar (dot) products $|V_{x'}| = V_{x'} \cdot V_{x'}$, $|V_{y'}| = V_{y'} \cdot V_{y'}$, $|V_{z'}| = V_{z'} \cdot V_{z'}$, and the three angles between the three voltage vectors as obtained from the three scalar products $V_{x'} \cdot V_{y'}, V_{x'} \cdot V_{z'}, V_{y'} \cdot V_{z'}$.

It is evident that these 6 quantities and thus the shape of the tetrahedron are invariant to any rotation of the three-axis sensor. Therefore, an antipodal position pair can be determined based on the 6 quantities for any rotation of the sensor. The three vector magnitudes $|V_{x'}|, |V_{y'}|, |V_{z'}|$ alone can provide an ambiguous position with one solution in each octant and six of these position ambiguities can be resolved by using the sign of any two of the three scalar products, as shown in Table 1.

TABLE 1

| Octant | x' | y' | z' | $V_{x'} \cdot V_{y'}$ | $V_{x'} \cdot V_{z'}$ | $V_{y'} \cdot V_{z'}$ |
|---|---|---|---|---|---|---|
| 1 | + | + | + | + | + | + |
| 2 | − | + | + | − | − | + |
| 3 | − | − | + | + | − | − |
| 4 | + | − | + | − | + | − |
| 5 | + | + | − | + | − | − |
| 6 | − | + | − | − | + | + |
| 7 | − | − | − | + | + | + |
| 8 | + | − | − | − | + | − |

For example, if the signs of $V_{x'} \cdot V_{y'}$ and $V_{x'} \cdot V_{z'}$ are both positive, the sensor is located either in octant 1 or octant 7. From Table 1 it can be easily seen that the third scalar product ($V_{y'} \cdot V_{z'}$ in the example of Table 1) does not bring any more information, thus it is redundant. However, it may be used to improve a position estimate in the case of voltage vector corruption by noise.

The residual bi-ambiguity may be eliminated by using a physical restriction of the location of the sensor relative to the generator. Such a physical restriction may be z'>0, meaning that the system is configured to return only determinations where the sensor is located in the z'>0 half space. In such implementations, any position except positions on or near the x'-y'-plane where z' is virtually zero may be principally determined unambiguously.

From FIG. 9 it can be easily seen that the residual bi-ambiguity of a 3-axis generator and a 3-axis sensor positioning system cannot be resolved by restricting the direction (rotation) of the sensor, e.g., φ'=0, θ'=0, ψ'=0, where φ', θ', and ψ' denote the roll, pitch, and azimuth (yaw) rotation angles, respectively, of the sensor relative to the generator's frame.

Moreover, the magnetic vector field patterns as obtained in a real magnetic vectoring system for vehicle positioning may be significantly distorted as compared to patterns obtained with ideal magnetic dipoles. Such distortion of the magnetic vector field pattern may occur if the size of the generator coils 602, 604, 606 and/or the sensor coils 612, 614, 616 are similar to the distance between them. Presence of the vehicle metallic chassis (underbody structure), a conductive ground, e.g., a ferroconcrete ground, and any other large metallic structures that may be located in the path between generator and sensor may also distort the magnetic dipole field. Practical tests in real environments however have shown that the basic field characteristics (field topology) resemble that of a dipole field and that the general findings on position ambiguity and resolution disclosed and discussed herein are also applicable to real vector fields. Though, special measures and algorithm for position and direction finding will be required to cope with field distortion of real environments.

A well-known difficulty associated with quasi-static magnetic field (e.g., near field) positioning techniques based on sensing an alternating magnetic field is the requirement for synchronization between the magnetic field generator and the magnetic field sensor. Absence of any synchronization information may lead to a signal polarity ambiguity issue. Though related in some situations, this polarity ambiguity issue should not be confused with the position ambiguity described above.

A magnitude, an orientation and a sense (polarity) may be attributed to a vector. Two vectors a and b may have equal length, equal orientation but an opposite sense (polarity), e.g., a=−b. Orientation and sense together define the direction of a vector. Without supplementary synchronization information it may be impossible to determine the polarity of the sensed magnetic field vector in correct relation to the polarity of the magnetic moment of the generating magnetic field, e.g., as shown in FIG. 9. Polarity ambiguity is particularly an issue of magnetic field transmissions that are substantially unmodulated or narrowband modulated sinusoidal (harmonic) carrier signals. For sinusoidal carrier signals the polarity ambiguity may be called a 180°-phase ambiguity.

Analyzing the 3-axis generator/3-axis sensor problem, it has been discovered that the relative polarities between the three voltage vectors $V_{x'}, V_{y'}, V_{z'}$ are only needed to resolve ambiguity that is principally resolvable. A bi-ambiguous position can be determined by the three vector magnitudes $|V_{x'}|, |V_{y'}|, |V_{z'}|$ and the sign of the scalar product of two vector pairs as shown in Table 1 above. While the magnitudes neither depend on the sensor's rotation nor on the vectors' polarity, the sign of the scalar products do. More precisely, they depend on the relative polarity of the vectors $V_{x'}$ and $V_{y'}$. The sign of the scalar product, e.g., $V_{x'} \cdot V_{y'}$, would change if the polarity of one of the vectors was changed, e.g., $(-)V_{x'} \cdot V_{y'}$. However, it would not change if the polarity of both vectors was changed, e.g., $(-)V_{x'} \cdot (-)V_{y'}$. Therefore, for a 3-axis generator/3-axis sensor system using sinusoidal transmissions, the receiver only needs information about the relative phases between the x'-, y'- and z'-magnetic field signals (e.g., what the phases are relative to one another rather than their absolute phases). Absolute phase information may not be needed. This however does not exclude implementations where absolute phase information is used, e.g., to improve a position estimate in the presence of noise.

Figure 10:
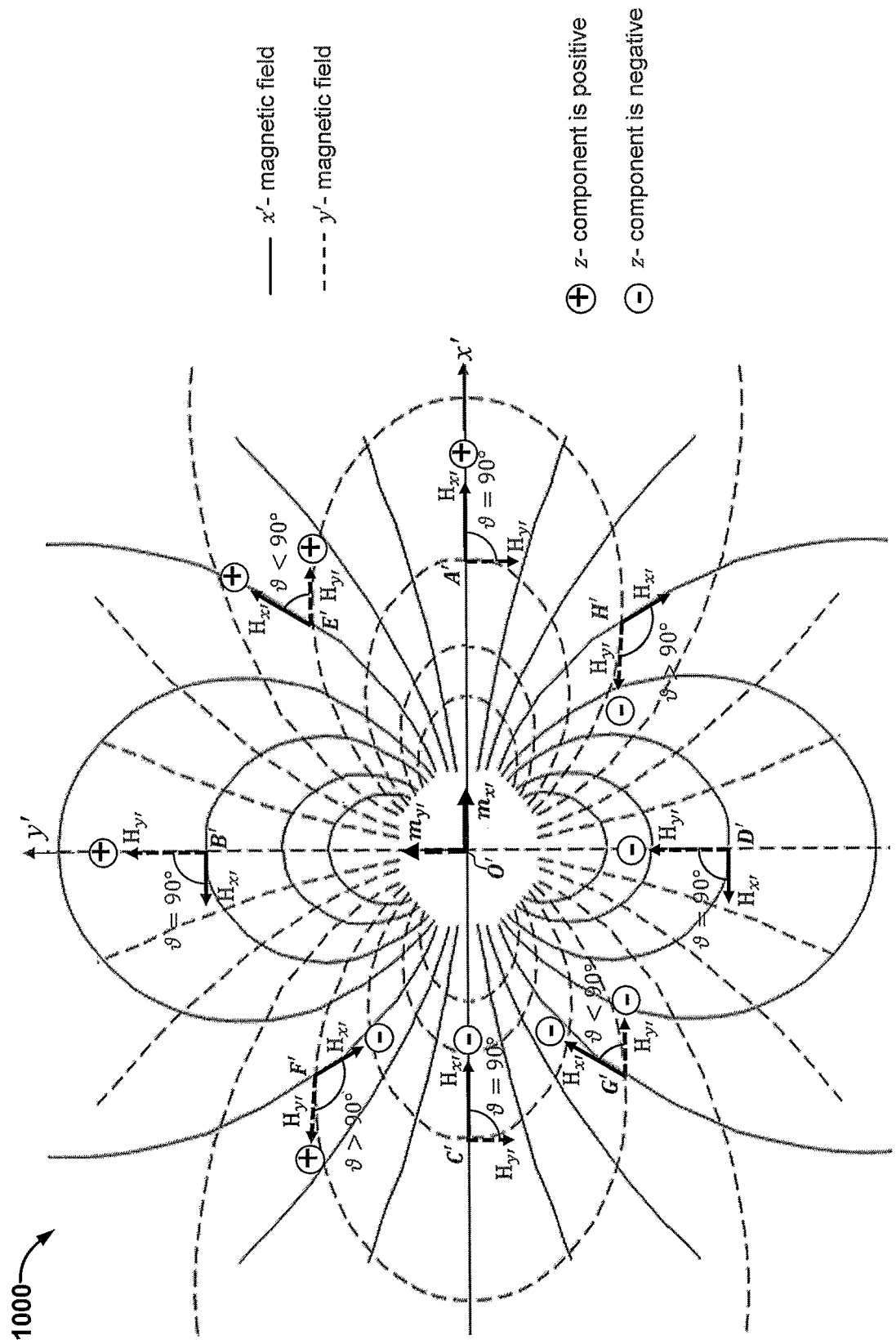
FIG. 10 displays field lines of a magnetic field generated by a 2-axis magnetic field generator and magnetic vector pairs present at 4 on-axis positions and 4 off-axis positions, in accordance with some implementations.

Different synchronization requirements may apply for a 2-axis generator/3-axis sensor or for a 3-axis generator/2-axis sensor system, as will be discussed below. In such configurations, knowledge of the absolute phase can help to resolve ambiguities, which will be shown for the application of vehicle positioning for wireless charging. FIG. 10 displays field lines of a magnetic field generated by a 2-axis magnetic field generator and magnetic vector pairs present at 4 on-axis positions and 4 off-axis positions, in accordance with some implementations. The field pattern 1000 shown refers to a cut plane that is parallel to the x'-y'-plane and offset by a height $z'_0 > 0$. In some vehicle positioning implementations, the x'-y'-plane may be considered the ground (or floor) and the offset plane at $z'_0$ the horizontal plane where the vehicle mounted sensor is located and in which it is moving. The magnetic moments $m_{x'}$ and $m_{y'}$ may refer to the magnetic moments of x'- and y'-generator coils 602, 604, respectively, as integrated into a base pad (see FIGS. 6 and 8). The origin O' of the x'-y'-coordinate frame is the magnetic center of the generator, which in some implementations may be in the base pad.

FIG. 10 also shows the horizontal components (parallel to the (x'-y'-plane) of the magnetic field vectors $H_{x'}$ and $H_{y'}$ of the x'- and y'-magnetic field, respectively, as well as the angle θ between the two vectors at 8 selected points. The encircled ± sign indicates the sign of the vector's z'-component that is perpendicular to the x'-y'-plane. A + sign indicates a z'-component extending out the front of the page, while a − sign indicates a z'-component extending out the back of the page. The 8 selected points comprise four on-axis points designated A', B', C', D' at equal distances from the origin O' and four off-axis points E', F', G', H' also the same distances from the origin O' and pairwise antipodal (e.g., diametric). As it can be seen in FIG. 10, vector pairs at on-axis points form an angle θ=90°, while vector pairs at off-axis points show pairwise (and antipodal) either an acute or obtuse angle (e.g., less than 90° and more than 90°, respectively). For the vehicle application, there are normally only three degrees of freedom for movement: the x'-y'-position and the azimuth (yaw) rotation angle ψ, hence the following physical restrictions for the sensor's coordinate frame may apply:

$z' \cong z'_0 > 0$ $\varphi' \cong 0$ $\theta' \cong 0$ where $\varphi' \cong 0$ and $\theta' \cong 0$ refer to the vehicle's roll and pitch angles, respectively, which may be considered substantially zero.

By inspecting FIG. 10 it can be found that an unambiguous position can be determined using a 2-axis generator/3-axis sensor system, provided that the above physical restrictions apply. Non-antipodal positions (e.g. A' and D') can be distinguished by the vectors' magnitudes $|H_{x'}|$, $|H_{y'}|$ and/or by the angle θ (e.g. E' and H'), while the antipodal positions (e.g. E' and G') whose horizontal components of vectors $H_{x'}$ and $H_{y'}$ are the same can be distinguished by their vertical (z'-)component. It can also be found that distinction is possible for any azimuthal rotation ψ ' of the sensor with respect to the generator, provided that the vector's true direction (polarity) can be determined, e.g., based on absolute phase information. It can be found that no vector pair matches another vector pair if rotated by any azimuth angle ψ' due to the z'-component, which is invariant to any azimuthal rotation.

However, if only relative phase information is available, there will be a bi-ambiguity, e.g., position A' cannot be distinguished from C'. This bi-ambiguity can only be resolved by introducing a further physical restriction either on the sensor's position, e.g., x'<0, or the sensor's rotation, e.g., −90°<ψ'<90°. In some applications of vehicle positioning there may be no need for resolving this bi-ambiguity. This may be true for systems that, for purposes of guidance and alignment, display the position of the charging spot as seen from the vehicle, e.g., on a dashboard display. For such park assist applications, it may be acceptable that users cannot distinguish the two scenarios, e.g., vehicle at position A' heading towards the base pad and vehicle at position B' heading towards the base pad. This may be also considered as a partially defined positional relationship as described above in the context of FIG. 4A to FIG. 4D where the driver cares about the direction of the vehicle 406 relative to the base pad 402 and thus relative to the parking stall.

Figure 11:
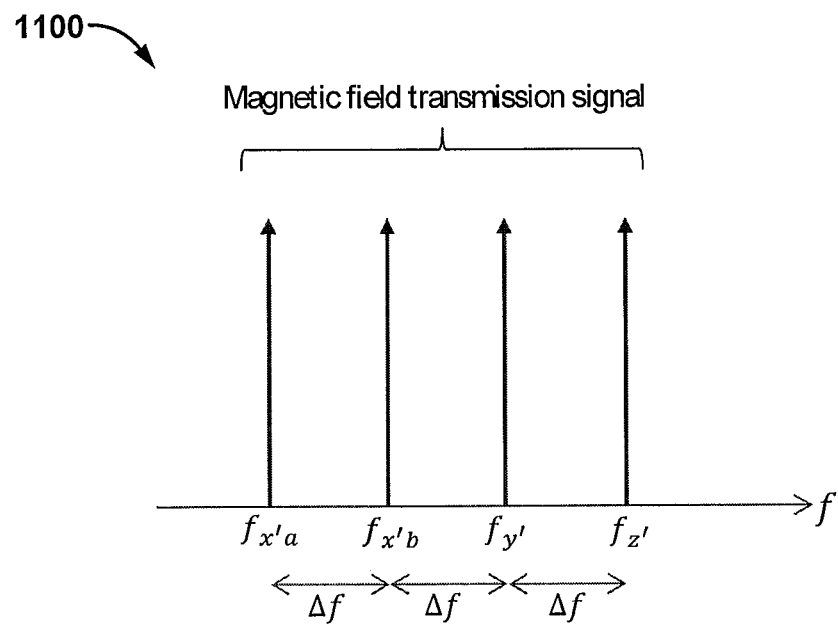
FIG. 11 illustrates a frequency division 4-tone magnetic field transmission scheme, in accordance with some implementations.

Relative phase synchronization may be accomplished in the magnetic field positioning receiver by means of a double tone (sinusoidal) signal that is used to generate at least one of the x'-, y'- and z'-magnetic fields of a multi-axis generator system. FIG. 11 illustrates a 4-tone magnetic field transmission in the frequency domain. Tones are equidistantly spaced by a frequency spacing Δf. The double tone is transmitted in the x'-field at frequencies $f_{x'a}$ and $f_{x'b}$. Single tones at frequencies $f_{y'}$ and $f_{z'}$ are transmitted in the y'- and z'-magnetic fields, respectively.

In a 2-axis generator system, only three tones may be transmitted, e.g., a double tone in the x'-field at frequencies $f_{x'a}$ and $f_{x'b}$ and a single tone at frequency $f_{y'}$ is transmitted in the y'-field. For purposes of redundancy and robustness against interference, a double tone at frequencies $f_{y'a}$ and $f_{y'b}$ may also be transmitted in the y'-field, also resulting in a 4-tone scheme.

Figure 12:
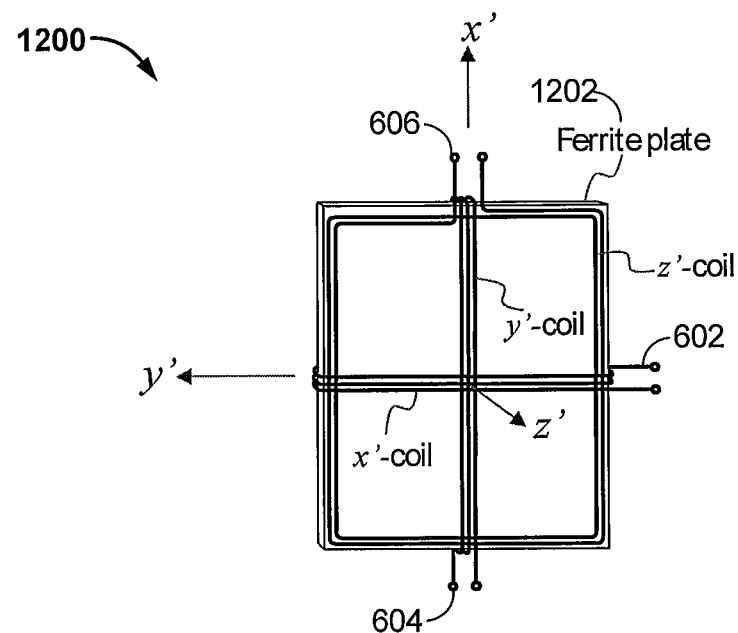
FIG. 12 shows a schematic view of an orthogonal coil arrangement for a 3-axis generator or sensor, in accordance with some implementations.

FIG. 12 shows a schematic view of an orthogonal coil arrangement for a 3-axis generator or sensor, in accordance with some implementations. The x'- and y'-coils 602, 604 are wound around a rectangular ferrite structure 1202 that may be the ferrite structure of an IPT coupler, while the z'-coil 606 may be disposed on the large surface of the ferrite structure 1202 along its edges. The x'-, y'-, and z'-coils 602, 604, 606 will generate magnetic moments in the directions of the x'-, y'-, and z'-axis, respectively, as indicated in FIG. 12. The same or similar coil arrangement may be used for a three-axis sensor, in which case, the coils would comprise sensor coils, e.g., x-, y-, and z-coils 612, 614, 616 (see FIG. 15).

FIG. 13A to FIG. 13K are schematic views of various coil arrangements as they may be used in various implementations of a magnetic positioning system. FIGS. 13A, 13B, 13C, 13H and 13J omit the IPT coil(s) to better show the coil windings dedicated for magnetic positioning, while FIGS. 13E, 13F, 13G, 13I and 13K show the same coil arrangements, respectively, with a "double D" or "DD"-type IPT coil on top. Though using sensor axis denotations x-, y-, and z, all these coil arrangements may also apply to a generator system.

The coil arrangement of FIG. 13A may apply to a 2-axis system generating magnetic moments or sensing field components in the direction of the x'- and y'-axis and including the x-coil 602 and the y-coil 604. The arrangement of FIG. 13E is substantially the same implementation as FIG. 13A, however, further illustrating a "DD"-IPT-coil 1302 disposed on or over the ferrite structure 1202. Since the "DD"-IPT-coil 1302 and the x-coil 602 are equally polarized, the "DD"-IPT-coil 1302 may also serve as an x-coil. Therefore, the x-coil 602 may be omitted in some implementations.

The arrangement of FIG. 13B may be used in a 3-axis generator or 3-axis sensor system, including the x-coil 602, the y-coil 604 and the z-coil 606. The arrangement of FIG. 13F is substantially the same implementation as FIG. 13B, however, further illustrating the "DD"-IPT-coil 1302 disposed on or over the ferrite structure 1202. The x-coil 602 may be omitted in some implementations, instead using the "DD"-IPT-coil 1302 for IPT and magnetic positioning.

The arrangement of FIG. 13C may apply to a 3-axis generator or 3-axis sensor system, but uses two coplanar x-coils (e.g., an x1-coil 602*a* and an x2-coil 602*b*) and two co-axial y-coils (e.g., a y1-coil 604*a* and a y2-coil 604*b*). For this coil arrangement, the ferrite structure is split into two halves 1202*a* and 1202*b*. In certain implementations, the two halves 1202*a* and 1202*b* are separated by a slot 1310 having a substantial width. The x1-coil 602*a* and the y1-coil 604*a* are wound around the left half 1202*a* in orthogonal directions, and the x2-coil 602*b* and the y2-coil 604*b* are wound around the right half 1202*b* of the ferrite structure, in orthogonal directions. The two y-coils 604*a*, 604*b* may be a consequence of splitting the ferrite into two halves, e.g., a single y-coil centered in the slot 1310 between the two ferrite halves may be unpractical. In this case, the y1-coil 604*a* and the y2-coil 604*b* may be connected in series forming a single y-coil 604. Such an arrangement may be used, e.g., for sensing the magnetic field as generated by a single-axis generator, a special implementation of a magnetic positioning system that is described in more detail in connection with FIG. 23 below. The arrangement of FIG. 13G is substantially the same implementation as FIG. 13C, however, further illustrating the "DD"-IPT-coil 1302 disposed on or over the ferrite structure 1202. Again, the x-coils 602*a*, 602*b* may be omitted in some implementations, instead using the "DD"-IPT-coil 1302 for IPT and magnetic positioning.

Alternatively, as shown in FIG. 13H, such a 3-axis coil arrangement may be built with a "monolithic" ferrite structure 1304 having a hole 1306 in the center and having only one y-coil 604 as shown in FIG. 13H. The "monolithic" ferrite structure 1304 may be built of a plurality of contiguously placed ferrite pieces (e.g. tiles). However, this hole 1306 is not a slot with a substantial width, as previously described in connection with FIG. 13C. FIG. 13I is substantially the same implementation as that shown in FIG. 13H, however, further including the "DD"-IPT-coil 1302. The x-coils 602*a*, 602*b* may be omitted in some implementations, instead using the "DD"-IPT-coil coil 1302 for IPT and magnetic positioning.

Another coil arrangement that may apply to a 3-axis generator or 3-axis sensor system is shown in FIG. 13J. This coil arrangement omits the z-coil 606 but uses instead two coaxial x-coils designated by x1-coil 602*a* and x2-coil 602*b*, and two coaxial y-coils, designated by y1-coil 604*a* and y2-coil 604*b*. Furthermore, it is assumed that these coaxial coils are pairwise wound in the same sense around the ferrite 1202. Using this arrangement, a z-component of a magnetic field may be sensed by subtracting the voltage signals received from the x2-coil 602*b* from the voltage signal received from the x1-coil 602*a*. Alternatively, the z-component of the magnetic field may be sensed by subtracting the voltage signal received from the y2-coil 604*b* from the voltage signal received from the y1-coil 604*a*. An x-component of the magnetic field may be sensed by adding the voltage signal received from the two x-coils 602*a*, 602*b*. Likewise, a y-component may be sensed by adding the voltages received from the two y-coils 604*a*, 604*b*.

Driving each x'-coil with currents that are equal in magnitude but opposite in phase would generate a net z'-magnetic field, provided that the x'-coils 602*a*, 602*b* are wound in the same sense. Assuming a frequency-multiplexed transmission, current drivers of the x'-coils 602*a*, 602*b* may be configured to supply current signals at frequency $f_{x'}$ and $f_{z'}$, respectively, at the same time in order to generate an x'- and z'-magnetic field using the same coil pair. Analogously, a z'-magnetic field may be generated by driving each y'-coil 604*a*, 604*b* with currents that are equal in magnitude but opposite in phase. FIG. 13K is substantially the same implementation as that shown in FIG. 13J, however, further including the "DD"-IPT-coil 1302. The x-coils 602*a*, 604*b* may be omitted in some implementations, instead using the IPT coil 1302 for IPT and magnetic positioning.

FIG. 13D shows a coil arrangement comprising the IPT coil alone and configured to generate or sense an alternating magnetic field, e.g., in the x'-axis direction (not shown in FIG. 13D). The IPT coil arrangement may be shared by the IPT system and a magnetic positioning system that is based on a single-axis generator or single-axis sensor as will be described in more detail in connection with FIG. 23.

Figure 14:
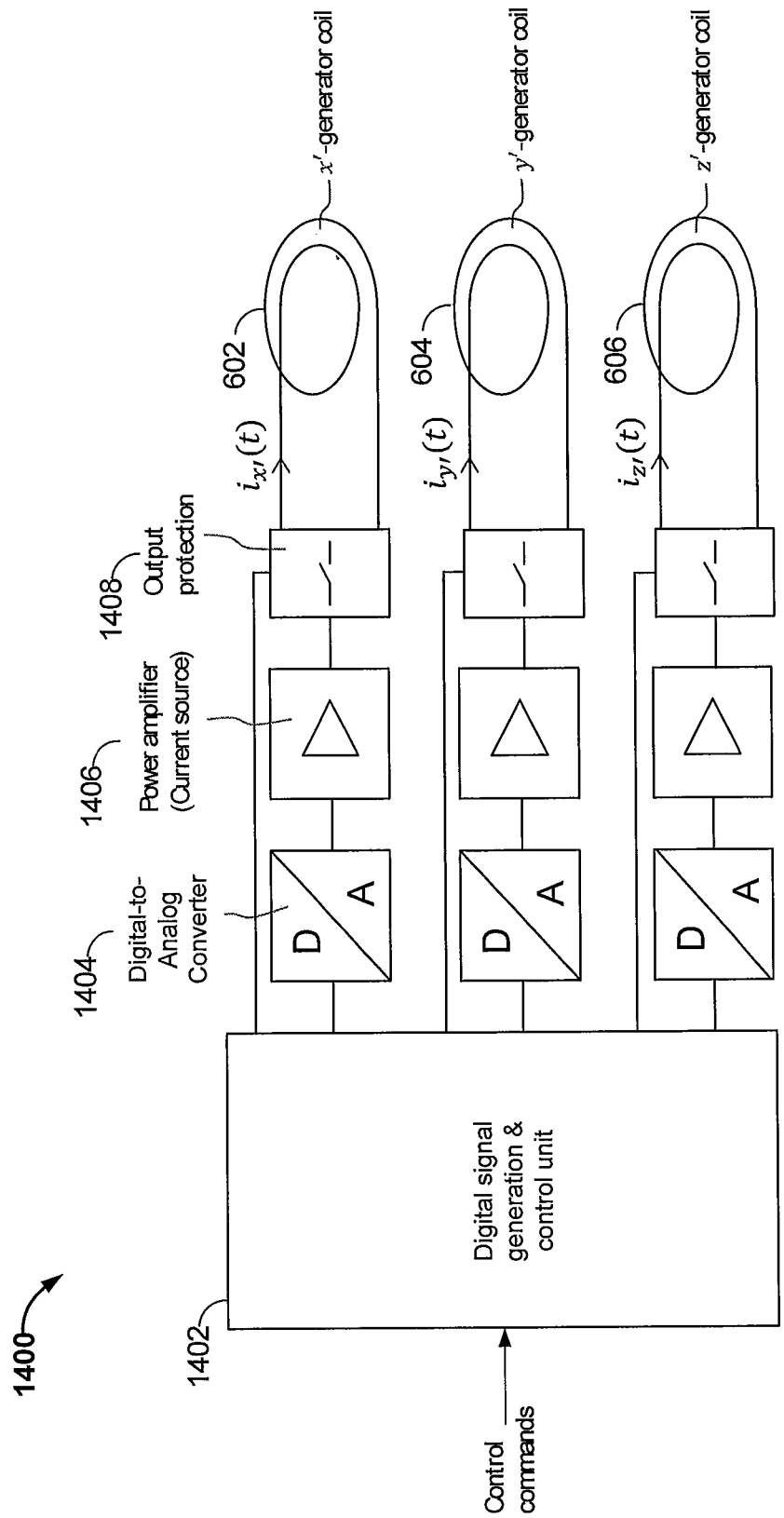
FIG. 14 shows a block diagram of a magnetic positioning transmitter, in accordance with some implementations.

FIG. 14 is a block diagram of a magnetic field positioning transmitter 1400 for a 3-axis generator, in accordance with some implementations. It is composed of a digital signal generation and control unit 1402 and a 3-channel analog driver circuit. Each analog driver channel is essentially comprised of a digital-to-analog (D/A-) converter 1404, a power amplifier 1406, and an output protection circuit 1408. The power amplifier 1406 may act as a current source accurately driving the associated generator coil 602, 604, 606 with the desired waveform. The output protection circuit 1408 serves to prevent overload or damage of the power amplifier 1406 (current source) when inductive power transfer is active, inducing high voltages into the generator coils 602, 604, 606. This may be true for the x'-coil 602, assuming a coil arrangement in accordance with one of FIG. 13E to FIG. 13G. Since the other coils 604, 606 are substantially orthogonal to the "DD"-type IPT coil 1302 (not shown in FIG. 14), induced voltages may be considerably lower. Nevertheless, there may be a need for an output protection circuit 1408 at the x'- and y'-channel outputs, since presence of the other IPT coupler may distort the magnetic field resulting in some coupling even between mutually orthogonal coils.

In some implementations, the output protection circuit 1408 is realized using an electromechanical (relay) switch for disconnecting the coil 602 from the power amplifier 1406. The switch must withstand the voltage that may be induced into the coils 602, 604, 606 when IPT is active. As opposed to short-circuiting a coil, which might be simpler, disconnecting (open-circuiting) a generator coil avoids induced currents, heating effects and consequent detuning and power loss effects in the IPT system.

Figure 15:
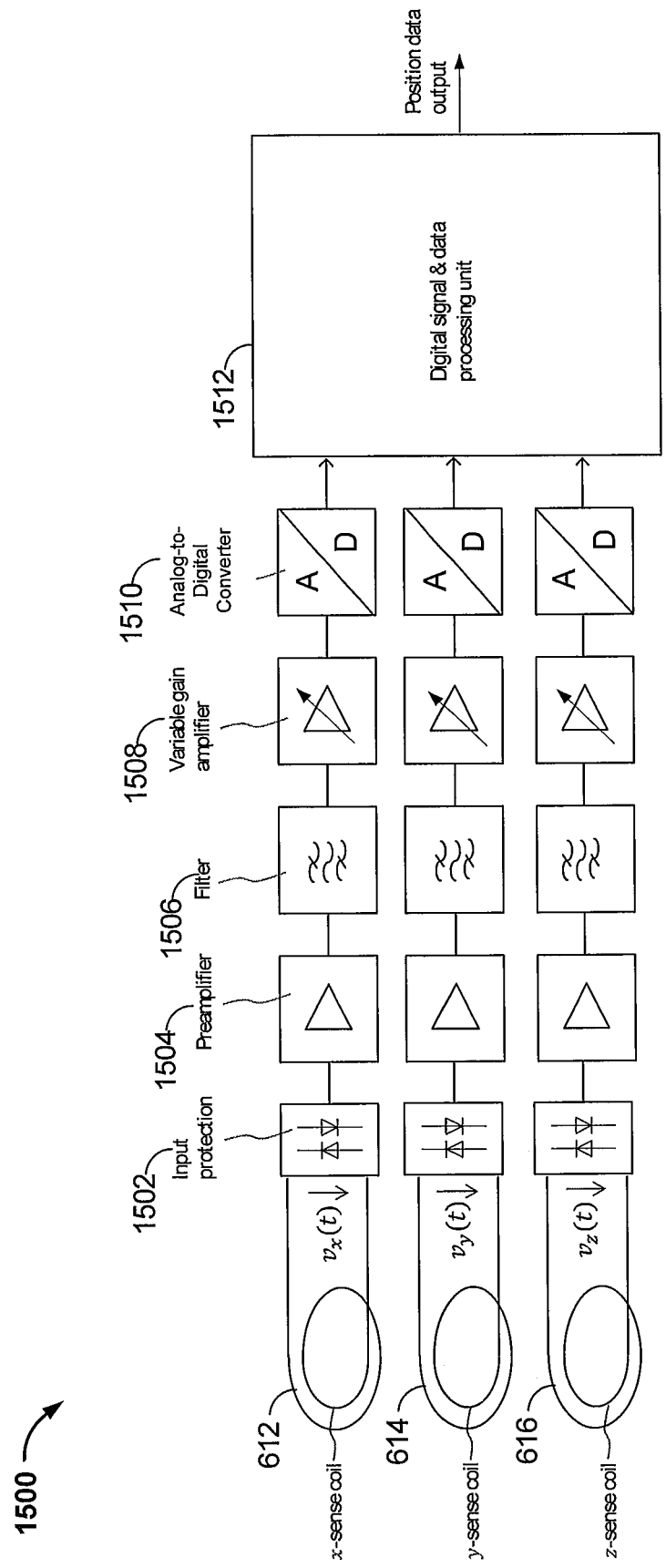
FIG. 15 shows a block diagram of a magnetic positioning receiver, in accordance with some implementations.

FIG. 15 shows a block diagram of a magnetic positioning receiver 1500 for a 3-axis sensor, in accordance with some implementations. The receiver 1500 comprises a 3-channel analog front end (AFE) and a digital signal and data processing unit 1512. The AFE amplifies and filters the analog input voltages $v_x(t)$, $v_y(t)$, and $x_z(t)$ received by the x-, y-, and z-sense coils 612, 614, 616, respectively, and converts them to digital signals. Each of the three AFE channels is comprised in essence of an input protector (limiter) 1502, a preamplifier 1504, a filter 1506, a variable gain amplifier 1508, and an analog-to-digital (A/D-) converter 1510.

The input protector 1502 serves to protect the AFE input (preamplifier) when the magnetic field sensor (e.g., the sense coils 612, 614, 616) is exposed to a strong magnetic field, e.g., when IPT is active. The protection circuit 1502 limits the input voltage and is designed in a manner such that there is substantially no current flow when the circuit 1502 is limiting so that substantially no power loss and consequent heating effects occur.

The preamplifier 1504 may have a gain (e.g. 20 dB), a high impedance input (>100 kΩ), and a relatively low output impedance (e.g. <50 Ohm) for driving the following filter 1506 stage.

The filter 1506 may be a bandpass filter having a passband with reasonably low ripple and sufficient width to cover the full frequency band as it may be specified for magnetic vectoring and having sufficient suppression (e.g. >60 dB) of signals received out-of-band, particularly at IPT operating frequencies, e.g., 85 kHz. The filter 1506 may also act as an anti-aliasing filter as needed for sampling the signal in the A/D-converter 1510.

The variable gain amplifier 1508 ensures that the A/D-converter 1510 always operates in the favorable range over the large dynamic range and may compensate for the large receive signal level variations between a "near" and a "far" point due to the $3^{rd}$ power law of magnetic field strength vs. distance decay. The variable gain amplifier 1508 may be controlled by the digital processing unit 1512 that follows the AFE providing an automatic gain control function (not shown in FIG. 15).

FIGS. 16-23 show schematic diagrams of various implementations and integrations of a magnetic positioning system with an IPT system forming one integrated (combined) system. In particular, FIGS. 16-23 show the IPT system using IPT coupler coils, designated by their inductances L1 and L2, in the top part, and the magnetic positioning system with coils for generating and sensing the positioning magnetic fields, also designated by their inductances Lx', Ly', Lz', Lx, Ly, Lz, in the bottom part of FIGS. 16-23.

Figure 16:
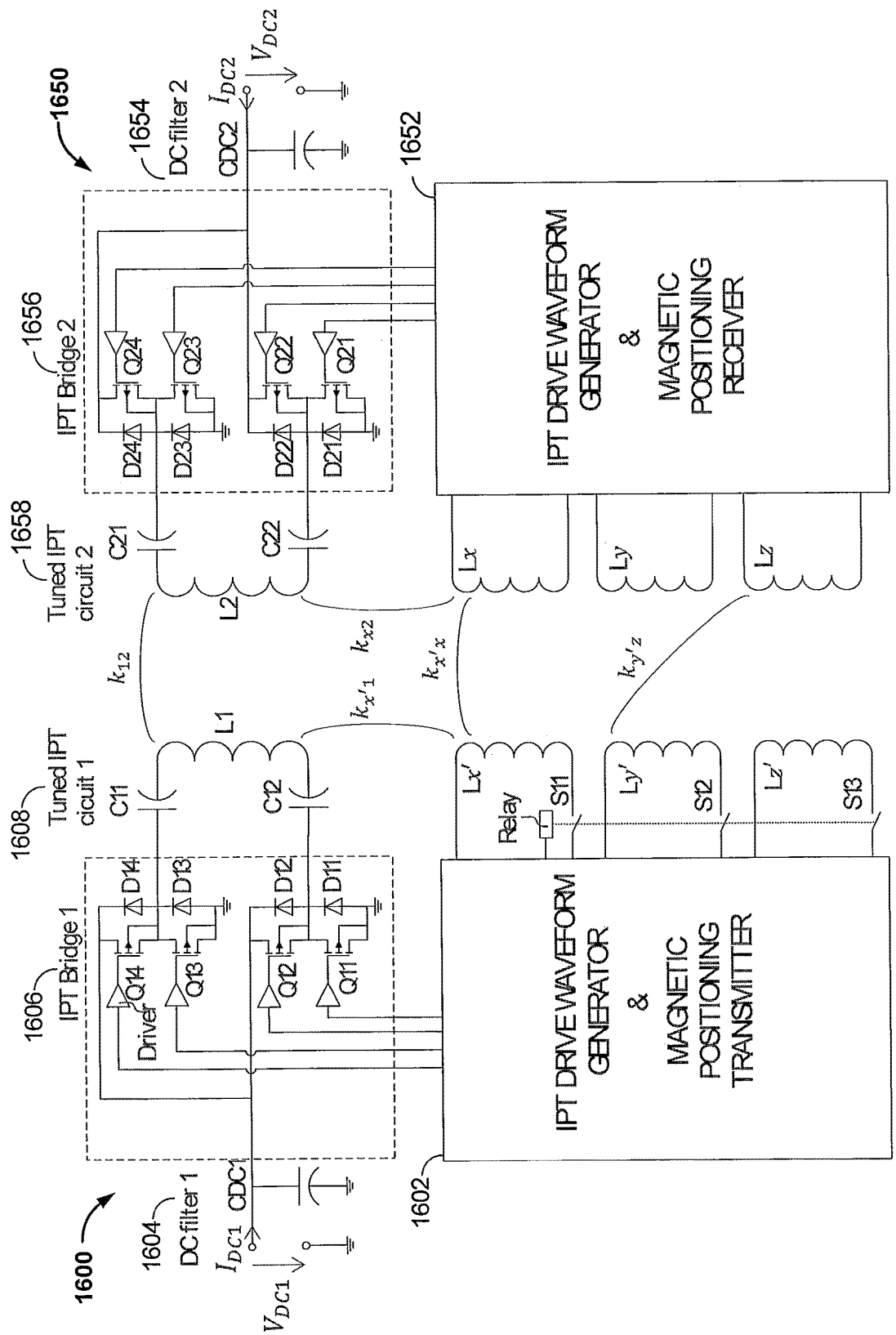
FIG. 16 shows a schematic diagram of a magnetic positioning system integrated with a series-tuned IPT system, in accordance with some implementations.

The IPT system comprises a first subsystem (shown at the left side) of FIG. 16, and a second subsystem (shown at the right side) of FIG. 16. The first IPT subsystem may either be an IPT transmitter or an IPT receiver, depending on the use case and the particular implementation. The same but in reciprocal is true for the second IPT subsystem. For example, if the first IPT subsystem operates as a receiver, the second will normally act as a transmitter. The magnetic positioning system comprises a magnetic positioning transmitter 1602 at the bottom left of FIG. 16, and a magnetic positioning receiver 1652 at the bottom right of FIG. 16.

In some implementations, the magnetic positioning transmitter 1602 may be collocated with an IPT transmitter. In another implementation, the magnetic positioning transmitter 1602 may be collocated with an IPT receiver. In yet another implementation, the magnetic positioning transmitter 1602 may be collocated with a bidirectional IPT subsystem that may act either as IPT transmitter or IPT receiver. The same is true for the magnetic positioning receiver 1652. However, if the magnetic positioning transmitter 1602 is collocated with a first IPT subsystem in receive mode, the magnetic positioning receiver 1652 will normally be collocated with the second IPT subsystem in transmit mode.

Moreover, FIGS. 16-23 show the magnetic positioning transmitter 1602 and the drive waveform generator of the first IPT subsystem combined in one unit. The same is true for the magnetic positioning receiver 1652 and the drive waveform generator of the second IPT sub system.

A fully symmetric circuit topology is assumed for the IPT system of FIG. 16, in accordance with some implementations. The first IPT subsystem is comprised of a DC filter 1 1604, an IPT bridge 1 1606, and a tuned IPT circuit 1 1608 including an IPT coupler, designated by its inductance L1. The DC filter 1 1604 serves for stabilizing (smoothing) the DC voltage ($V_{DC1}$) or DC current ($I_{DC1}$), whichever applies. The IPT bridge 1 1606 comprises four electronic switches Q11, Q12, Q13, Q14, each having a control input driven by a respective driver, and four parallel diodes D11, D12, D13, D14. An electronic switch may be one of a transistor, field effect transistor (FET), insulated gate bipolar transistor (IGBT), and any other type of electronic switch suitable for IPT. In transmit mode, the IPT bridge 1 1606 operates as an inverter and in receive mode as a rectifier. The electronic switches Q11, Q12, Q13, Q14 are controlled by the IPT drive waveform generator and magnetic positioning transmitter 1602. In IPT transmit mode, the electronic switches Q11, Q12, Q13, Q14 are dynamically switching (toggling) according to a pulse width modulation scheme, in accordance with some implementations. The diodes D11, D12, D13, D14 act as freewheeling diodes, as normally required in an IPT bridge. In IPT receive mode, all of the electronic switches Q11, Q12, Q13, Q14 may be in a static open-state, so that the diodes D11, D12, D13, D14 act alone as the rectifier. In some alternative implementations, e.g., an active or synchronous rectifier, the electronic switches Q11, Q12, Q13, Q14 may also be dynamically switching but synchronously with the power signal received from the IPT transmitter. Additional means, as they may be required for achieving synchronous rectification (e.g., current/voltage sensors etc.), are not shown in FIGS. 16-23.

The second IPT subsystem is not further detailed here as it shows a fully symmetric circuit topology to the first IPT subsystem, for example, the IPT drive waveform generator & magnetic positioning receiver 1652, the DC filter 2 1654, the IPT bridge 2 1656, and the tuned IPT circuit 2 1658. Finally, FIGS. 16-23 assume magnetic positioning is inactive when IPT is active and vice-versa, in accordance with some implementations.

FIG. 16 shows an integrated (combined) IPT and magnetic positioning system with the first 1600 and second 1650 IPT subsystem in a series-tuned topology, in accordance with some implementations. Tuning (e.g., reactance compensation) of the inductance L1 is achieved using the series capacitors C11 and C12. Likewise, tuning (e.g., reactance compensation) of the inductance L2 is achieved using series capacitors C21 and C22. The DC filter 1 1604 and the DC filter 2 1654 are configured as parallel capacitors CDC1 and CDC2 for smoothing ripple in the DC voltages $V_{DC1}$ and $V_{DC2}$, respectively, in accordance with some implementations.

The magnetic positioning system of FIG. 16 is based on a 3-axis generator and a 3-axis sensor using dedicated generator coils, designated by their inductances Lx', Ly', Lz', to generate the x'-, y'- and z'-magnetic fields, and dedicated sensor coils, designated by their inductances Lx, Ly, Lz, to sense the x-, y- and z-axis components of each of the x'-, y'-, z'-magnetic fields, respectively. The generator coils Lx', Ly', and Lz' may correspond to the generator coils 602, 604, 606, while the sensor coils Lx, Ly, and Lz may correspond to the sensor coils 612, 614, 616, previously described in connection with FIGS. 6, 8 and 12-15. The generator coils are connected to the magnetic positioning transmitter 1602 via switches S11, S12, S13. In some implementations, these switches may be electromechanical (relay) switches, as indicated in FIG. 16. These switches S11, S12, S13 may form the output protection circuit 1408 previously described in connection with FIG. 14. In some other implementations, the switches S11, S12, S13 may be electronic switches (e.g. bipolar switches).

FIG. 16 also indicates coupling coefficients between some pairs of coils as considered relevant for explaining the system and some associated coupling effects. Coupling coefficient $k_{12}$ is relevant for IPT but may be also relevant for magnetic positioning as will be explained below, while the coupling coefficients $k_{x'x}$, and $k_{y'z}$, shown as examples, may be relevant for magnetic positioning only. In a 3-axis generator/3-axis sensor system there exist 9 coupling coefficients (2 of 9 shown in FIG. 16) linking generator input currents with sensor output voltages, given the inductances of each coil shown. These 9 coupling coefficients may be relevant for determining a position and rotation of the sensor relative to the generator.

As a further aspect of some implementations, FIG. 16 also indicates coupling coefficient $k_{x'1}$ between the IPT coupler coil L1 and the magnetic positioning generator coil Lx' and a coupling $k_{x2}$ between the IPT coupler coil L2 and the magnetic positioning sensor coil Lx. Assuming one of the coil arrangements as shown in FIGS. 13E-13G for the first 1600 and second 1650 IPT subsystems and for the magnetic positioning transmitter and receiver, there may be substantial coupling between L1 and Lx' and between L2 and Lx, as previously mentioned in the context of FIGS. 13E-13F. For "polarized"-type IPT couplers such as "DD"-type and "Solenoid"-type IPT couplers, the coupling coefficients $k_{x'1}$ and $k_{x2}$ may be in the range, e.g., of 0.3-0.8. But there may be substantially no coupling between L1 and Ly', L1 and Lz', L2 and Ly, or L2 and Lz. For "Circular"-type IPT couplers (not shown in FIG. 16), there may be substantial coupling between L1 and Lz' and L2 and Lz, but substantially no coupling between L1 and Lx', L1 and Ly', L2 and Lx, L2 and Ly.

Depending on the coupling coefficient $k_{x'1}$, the magnetic positioning transmitter 1602 when active may induce substantial voltage into the IPT coil L1. Depending on the IPT coil's loading condition, this voltage may generate a current in L1 and thus a secondary magnetic field that may negatively counteract (partially cancel) the x'-magnetic field as generated by Lx'. Similarly, the IPT coil L2 may exert a negative impact on sensing the x-components of the magnetic fields, depending on $k_{x2}$ and on the loading condition of L2. This may be explained by the fact that each magnetic positioning field will also induce a voltage into L2 (couplings not indicated in FIG. 16), which may in turn produce a current in L2. Such currents will produce secondary magnetic fields that superimpose with the primary x'-, y', z'-magnetic fields, hence falsifying sensing of the primary fields.

To reduce negative parasitic effects of the IPT coils, the IPT coils may be open-circuited. In some implementations of a series-tuned system as shown in FIG. 16, this may be accomplished by opening all electronic switches Q11, Q12, Q13, Q14, and Q21, Q22, Q23, Q24, provided that voltages $V_{DC1}$ and $V_{DC2}$ are higher than peak voltages as induced by the magnetic positioning system into the IPT system. In some applications of an IPT system, e.g., for charging a battery, this condition may be achieved by leaving the DC voltage supply (not shown in FIG. 16) connected to the transmit-side IPT bridge and leaving the DC voltage load (e.g. the battery, not shown in FIG. 16) connected to the receive-side IPT bridge, when magnetic positioning is active. Once electronic switches are open-state, secondary current generation in the IPT circuits may be prevented or reduced to an acceptable or manageable amount. It shall be noted that some minor secondary currents may be generated due to parasitic capacitance in open-state electronic switches and diodes. To open electronic switches Q11, Q12, Q13, Q14, and Q21, Q22, Q23, Q24, a corresponding static drive signal is applied to all switches by the IPT drive waveform generators 1602, 1652.

Conversely, any damaging effect from IPT on the magnetic positioning transmitter 1602 due to coupling $k_{x'1}$ may be prevented by opening the switches S11, S12, S13, when IPT is active. Likewise, any damaging effect from IPT on the magnetic positioning receiver 1652 due to coupling $k_{x2}$ may be prevented by the input protection circuit 1502, as previously described in connection with FIG. 15.

Figure 17:
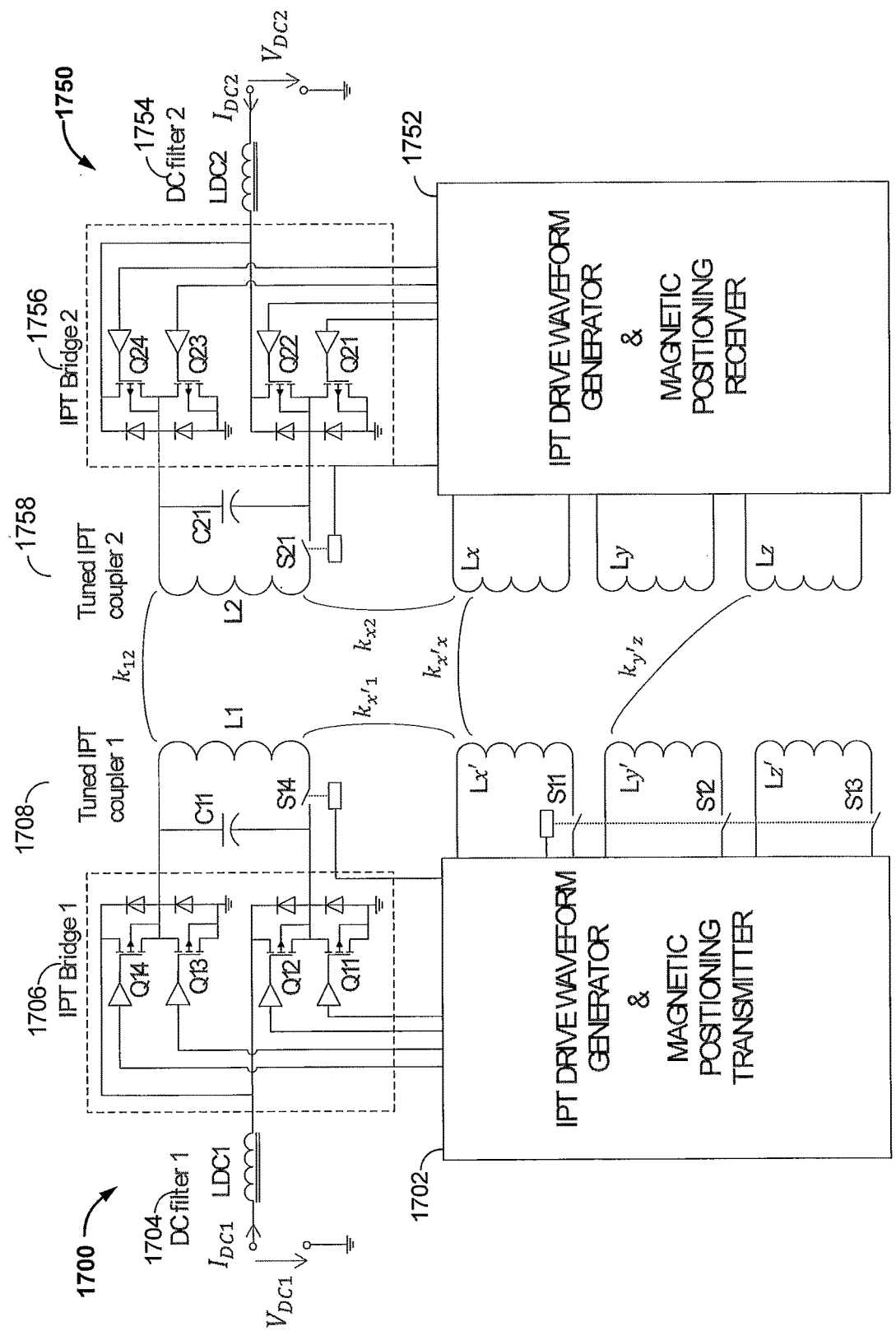
FIG. 17 shows a schematic diagram of a magnetic positioning system integrated with a parallel-tuned IPT system, in accordance with some implementations.

FIG. 17 shows an integrated (combined) IPT and magnetic positioning system with the first 1700 and second 1750 IPT subsystem in a parallel-tuned topology, in accordance with some implementations. Tuning (reactance compensation) of the inductance L1 is achieved by the parallel capacitor C11. Likewise, tuning (reactance compensation) of the inductance L2 is achieved by the parallel capacitor C21. The DC filter 1 1704 and the DC filter 2 1754 are configured as series inductors (chokes) LDC1 and LDC2 for smoothing ripple in the DC currents $I_{DC1}$ and $I_{DC2}$, respectively, in accordance with some implementations.

Furthermore, FIG. 17 also assumes a 3-axis generator/3-axis sensor magnetic positioning system using dedicated generator coils (Lx', Ly', Lz') and dedicated sensor coils (Lx, Ly, Lz). The dedicated generator coils (Lx', Ly', Lz') may correspond to the coils 602, 604, 606 and the dedicated sensor coils (Lx, Ly, Lz) may correspond to the coils 612, 614, 616 as previously described. The generator coils are connected to the magnetic positioning transmitter 1702 via switches S11, S12, S13. In some implementations, these switches may be electromechanical (relay) switches and may form the output protection circuit 1408 previously described in connection with FIG. 14. In some other implementations, the switches S11, S12, S13 may be electronic switches (e.g. bipolar switches).

FIG. 17 also indicates coupling coefficients between some pairs of coils as considered relevant for the reasons previously described in connection with FIG. 16. Assuming substantial coupling for $k_{x'1}$ and $k_{x2}$, a detrimental impact of the IPT on the magnetic positioning system as discussed above may be expected. Since capacitors C11 and C21 are connected in parallel, opening the electronic switches Q11, Q12, Q13, Q14, and Q21, Q22, Q23, Q24 as disclosed above may not prevent an issue, even if the resonant frequency defined by L1 and C11 and by L2 and C21 differs from the magnetic positioning frequency. Therefore, in some implementations of a parallel-tuned system, IPT coils are open-circuited by means of additional switches S14 and S24. Opening these switches, when magnetic positioning is active, may prevent or reduce detrimental effects from the IPT system on the magnetic positioning system. In some implementations, the switches S14 and S24 are electromechanical (relay) switches. These switches may be rated for the high resonant currents of an ITP system. In some other implementations, the switches S14 and S24 may be electronic switches selected for static switching, with a low enough on-state resistance (e.g. <10 mOhm), and with low enough off-state capacitance when magnetic positioning is active.

Figure 18:
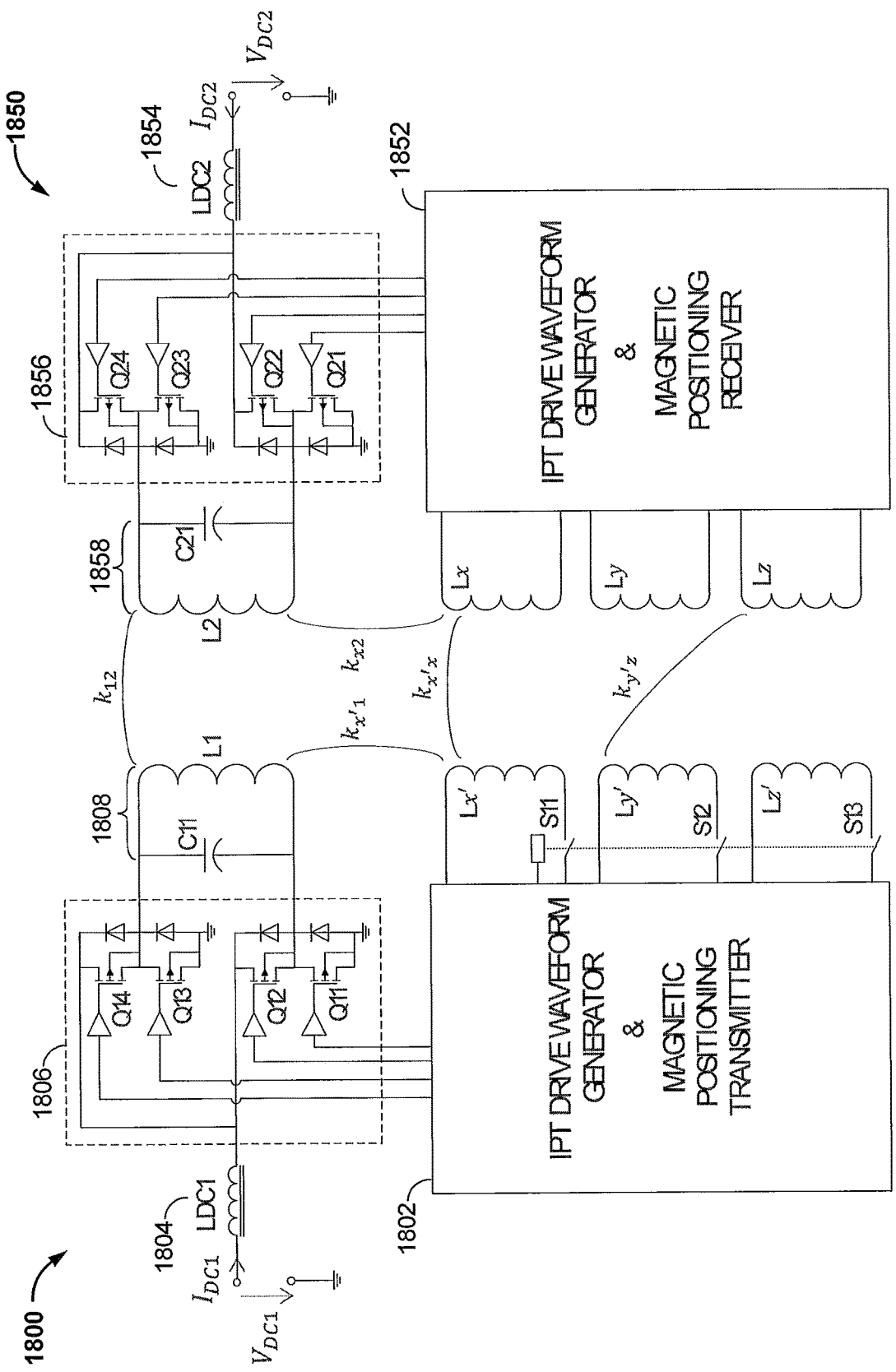
FIG. 18 shows a schematic diagram of a magnetic positioning system integrated with a parallel-tuned IPT system that can be open circuited, in accordance with some implementations.

FIG. 18 shows an integrated (combined) parallel-tuned IPT and 3-axis generator/3-axis sensor magnetic positioning system, in accordance with another implementation. Tuning (reactance compensation) is achieved as previously described in connection with FIG. 17.

The implementations shown by FIG. 18 omit switches S14 and S21 as shown in FIG. 17, which may be considered a measure of complexity and cost reduction. It shall be noted that the switches S14 and S21 may be expensive components considering the requirements. Instead, the IPT coils L1 and L2 are short-circuited by using the electronic switches of the IPT bridge 1 1806 and the IPT bridge 2 1856, e.g., by closing the switches Q11, Q12 and Q21, Q22, respectively, when magnetic positioning is active. Short-circuited IPT coils L1 and L2 may affect the magnetic positioning system in a more reproducible and deterministic manner compared with resonant tuned IPT circuits, whose resonant frequency may vary with component tolerances, temperature, aging, distance (offset) between first and second IPT coupler, e.g., due to mutual detuning effects. Moreover, magnetic positioning may operate at different frequencies as previously mentioned, which may involve undesirable frequency dependent effects. Therefore, short-circuiting IPT coils L1 and L2, which removes resonance from the critical frequency range, may be considered a reasonable performance-cost trade-off.

However, short-circuiting L1 and L2 may impose some constraints on a particular system implementation, e.g., coupling coefficients $k_{x'1}$ and $k_{x2}$ not higher than, for example, 0.8, and the coupling coefficient $k_{12}$ being similar to the coupling coefficient $k_{x'x}$. It shall be noted that inductance Lx' diminishes when L1 is short-circuited, which may be expressed as a ratio given by Equation (4):

$$\frac{Lx'c}{Lx'} = 1 - k_{x'1}^2 \qquad (4)$$

where Lx'c denotes the inductance of the x'-coil when L1 is short-circuited. The same equation may apply to the inductance diminishing effect of a short-circuited coil L2 on Lx.

In some implementations, effects of a short-circuited IPT coil are corrected, e.g., using correction factors in the position determination algorithm. In some other implementations, loss of inductance Lx' and hence magnetic moment and loss of inductance Lx and hence induced voltage is compensated for by increasing the drive current of Lx' and increasing a gain in the magnetic positioning receiver as shown in FIG. 15, respectively. In yet another implementation, loss of inductances Lx' and Lx is compensated for by increasing the turn count of the generator coil Lx' and of the sensor coil Lx.

Damage of the magnetic positioning transmitter's output due to coupling $k_{x'1}$ and overvoltage may be prevented by opening the switches S11, S12, S13, when IPT is active. Likewise, damage of the magnetic positioning receiver's input due to the coupling coefficient $k_{x2}$ and overvoltage may be prevented by the input protection circuit 1502, as previously described in connection with FIG. 15.

Figure 19:
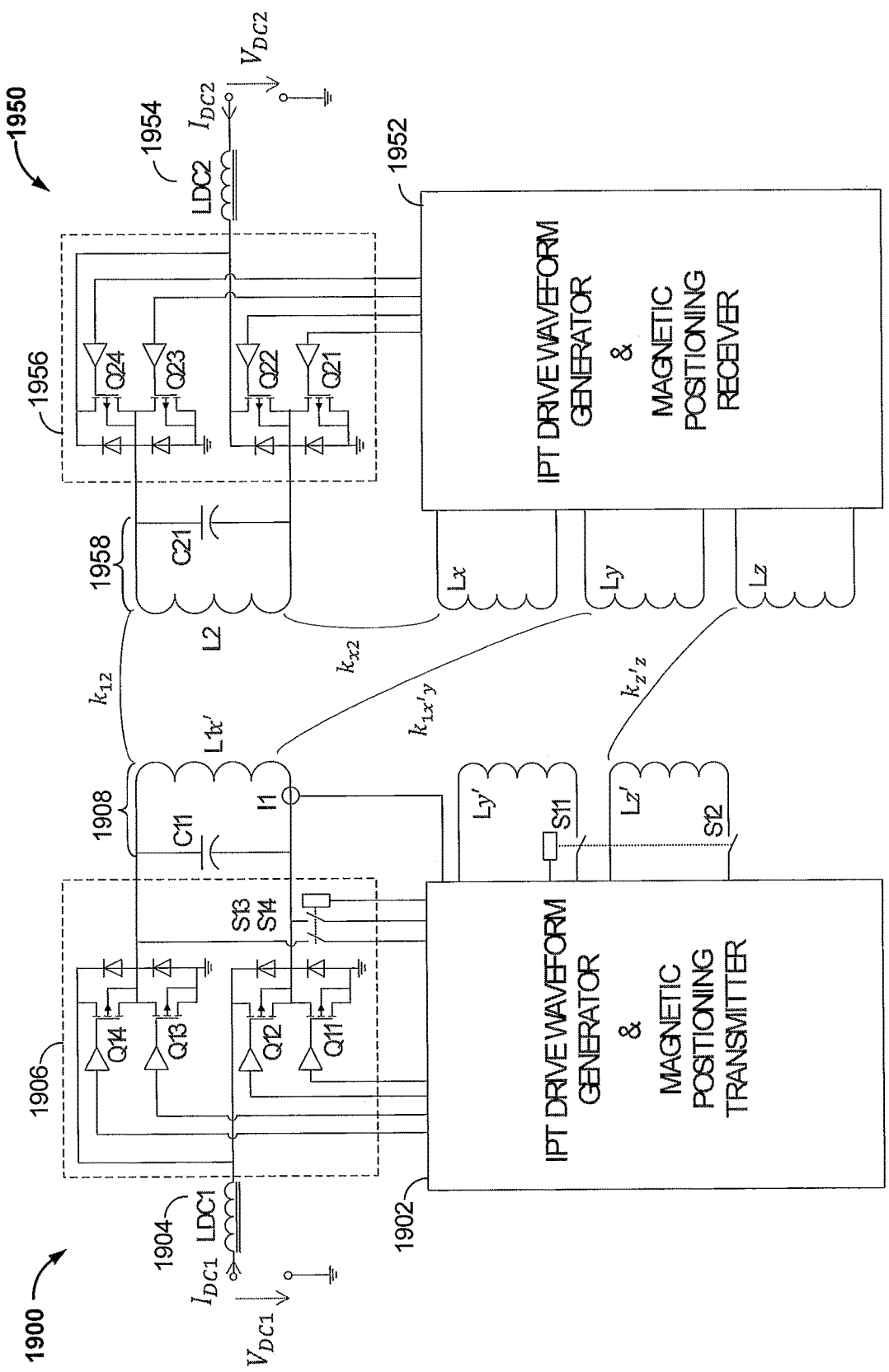
FIG. 19 shows a schematic diagram of a magnetic positioning system integrated with a parallel-tuned IPT system, where the magnetic positioning system uses the IPT coil as the x'-coil, in accordance with some implementations.

An integrated (combined) parallel-tuned IPT and 3-axis generator/3-axis sensor magnetic positioning system, in accordance with a further implementation, is shown in FIG. 19. This implementation may be substantially as previously described in connection with FIGS. 17-18, however, omitting the coil Lx', and instead uses the IPT coil L1, now designated L1x', for magnetic positioning. This also eliminates the cross-coupling issue between the IPT coil and the corresponding coil. L1x' is driven by a current generated by the magnetic positioning transmitter 1902 via switches S13 and S14. These switches may be electromechanical (relay) switches or any other suitable electronic switches (e.g. bipolar switches). When magnetic positioning is active, the switches S13 and S14 are closed and the electronic switches Q11, Q12, Q13, Q14 are in open-state. When IPT is active, the switches S13 and S14 are in open-state and the electronic switches Q11, Q12, Q13, Q14 are toggling as dictated by the IPT drive waveforms. The switches S13 and S14 may be rated for magnetic positioning currents and ψ T voltage requirements. Since some drive current will be bypassed at parallel tuning capacitance C11 and possibly also in parasitic capacitances of other electronic switches, the current source power amplifier (see FIG. 14) may need an external sensor (I1) to measure and control the effective magnetic positioning current in L1x' with the required accuracy.

A similar approach (not shown in FIG. 19) may apply to the receive-side 1950 by omitting the sense coil Lx and instead using the IPT coil L2 for sensing the magnetic fields. However here, the parasitic effects of the parallel capacitance C21 and possibly of open-state electronic switches may be more difficult to control such that use of a dedicated magnetic position coil Lx and short-circuiting L2 may be a preferred solution in many cases.

Figure 20:
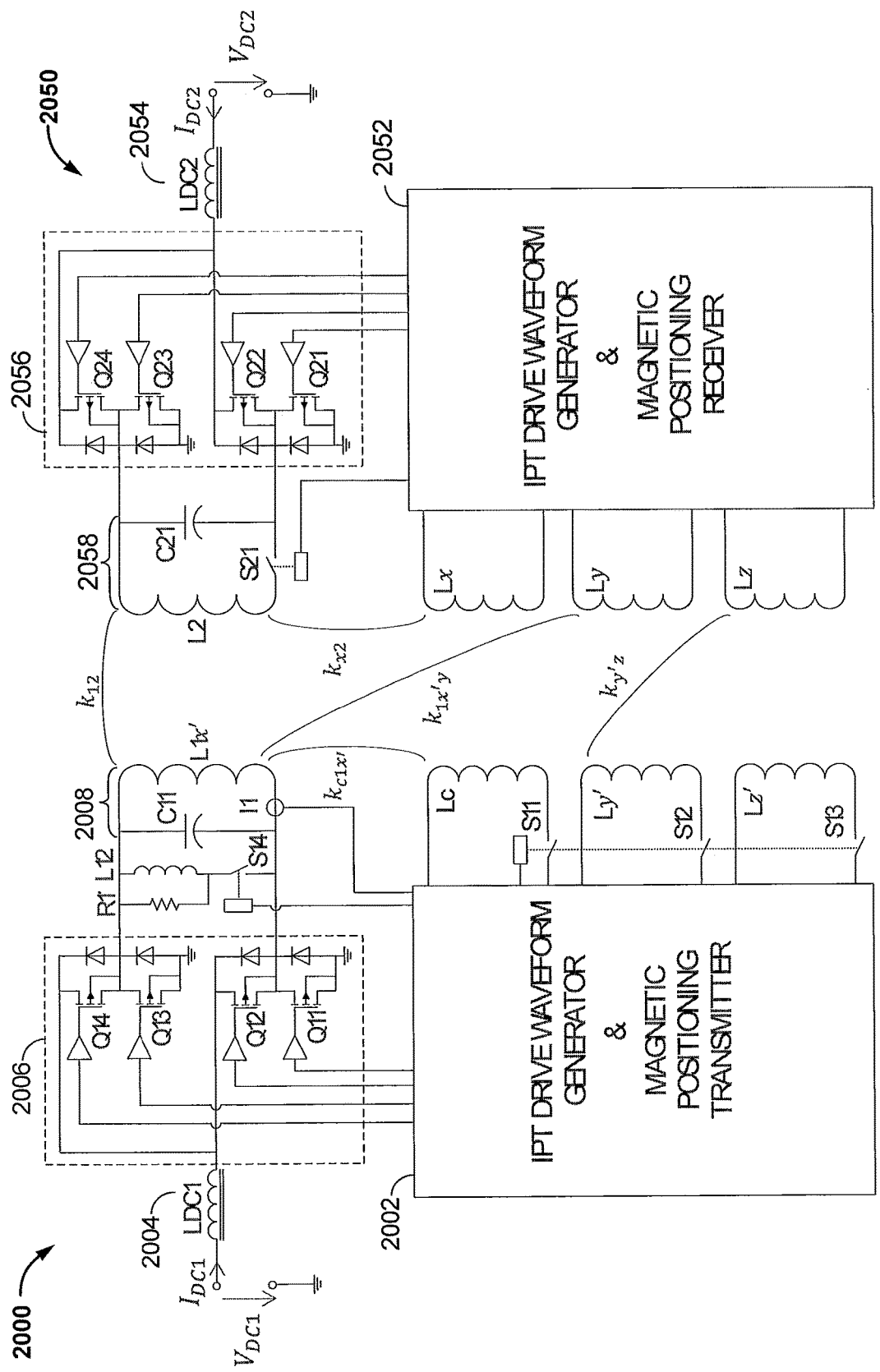
FIG. 20 shows a schematic diagram of a magnetic positioning system integrated with a parallel-tuned IPT system, where the magnetic positioning system uses the IPT coil as the x'-coil via inductive coupling, in accordance with some implementations.

FIG. 20 shows yet another implementation of an integrated (combined) parallel-tuned IPT and 3-axis generator/3-axis sensor magnetic positioning system. This implementation also uses the IPT coil L1 (designated by L1x' in FIG. 20) as the coil Lx'. However, coupling of the magnetic positioning transmitter 2002 to L1x' is accomplished inductively (indicated by $k_{c1x'}$ in FIG. 20) using a coupling coil Lc that is connected to the magnetic positioning transmitter via the switch S11. This is in contrast to the implementation of FIG. 19, where coupling is galvanic.

A coil arrangement in accordance to FIG. 13F may apply to this implementation, whereby the x'-coil 602 now plays the role of the coupling coil Lc. The switch S11 may prevent damage of the magnetic positioning transmitter due to coupling $k_{c1x'}$, when IPT is active.

To make inductive coupling more effective and to ensure that the coil L1x' becomes the predominant generator of the x'-magnetic field, tuned IPT circuit 1 2008 is retuned to resonate at a magnetic positioning frequency, e.g., at the center frequency of the magnetic positioning frequency band, when magnetic positioning is active. Assuming that magnetic positioning operates at frequencies higher than IPT frequencies, this may be accomplished by switching the inductance L12 and the resistance R1, connected in parallel to L1x' and C11, when magnetic positioning is active. The switch S14 is closed and Q11, Q12, Q13, Q14 are in open-state when magnetic positioning is active. Connecting an inductance L12 in parallel increases the resonant frequency of the tuned IPT circuit 1 2008, while the resistance R1 in parallel dampens resonance (lowers Q-factor). Such a dampened resonance may be required to artificially broaden the bandwidth of the circuit. When IPT is active, the switch S14 is in open-state so that the ordinary IPT tuning applies.

Since resonant current in L1x' in magnetic positioning mode may not be found in a fixed ratio to current in Lc, e.g., due to component tolerances, frequency dependency, etc., the current source power amplifier 1406 of the magnetic positioning transmitter (ref. FIG. 14) may need an external sensor (I1) to measure and control the effective magnetic positioning current in L1x' with the required accuracy.

A similar approach (not shown in FIG. 20) may also apply to the receive-side 2050 by using L2 as the sense coil (L2x) and Lx as the coupling coil (not shown in FIG. 20).

However, handling component tolerances, frequency dependent effects, etc., the receive-side 2050 may be more difficult. Therefore, using a dedicated magnetic position coil Lx and short-circuiting L2 may be preferable in many cases. Otherwise, L2 may be open-circuited using switch S21 as shown in FIG. 20.

Figure 21:
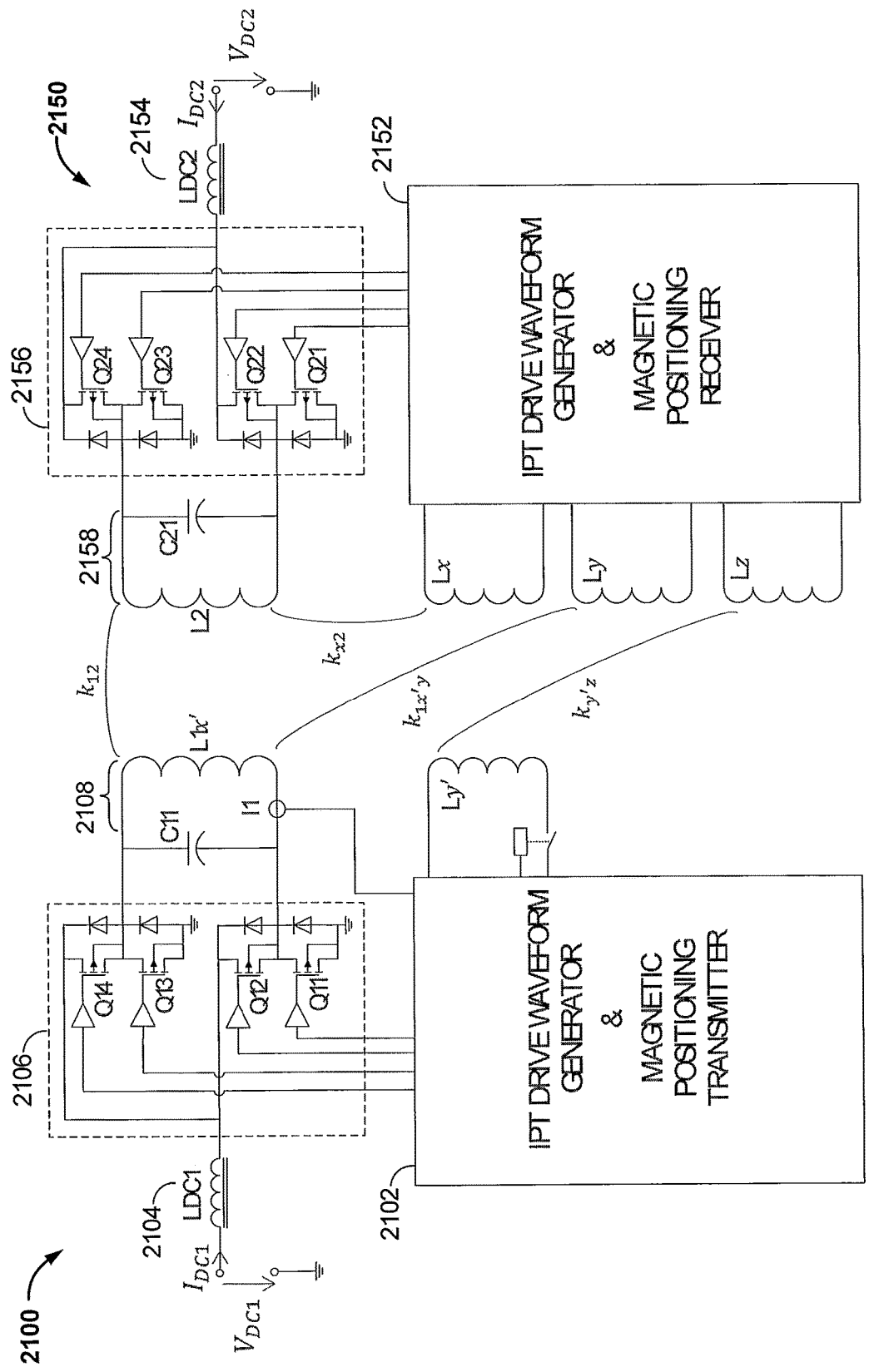
FIG. 21 shows a schematic diagram of a magnetic positioning system integrated with a parallel-tuned IPT system, where the magnetic positioning system generates the x'-magnetic field using the IPT inverter, in accordance with some implementations.

An integrated (combined) parallel-tuned IPT and 3-axis generator/3-axis sensor magnetic positioning system, in accordance with some other implementations, is shown in FIG. 21. These implementations again uses IPT coil L1 (designated by L1x' in FIG. 21) as the coil Lx'. However, the IPT coil L1x' is now driven by the IPT bridge 1 2106 rather than directly by the magnetic positioning transmitter 2102. When magnetic positioning is active, the IPT drive waveform generator and magnetic positioning unit 2102 may generate the appropriate PWM drive waveforms as required to generate the x'-magnetic field at the required frequency. The IPT bridge 1 2106 will generate a rectangular wave signal with considerable harmonic content. Since tuned IPT circuit 1 2108 is normally tuned to the IPT frequency, it may be off-tuned for magnetic positioning. Nevertheless, the IPT bridge 1 2106 may be able to excite the generator coil L1x' at the current level required to generate the x'-magnetic field. It may be also found that higher order harmonics get sufficiently suppressed by the filtering effect of L1x' and C11, so that applicable harmonic emission limits can be met. It shall be noted that current levels as needed for magnetic positioning may be significantly lower than IPT current levels. This may be also true for the harmonic current levels.

However, the IPT bridge 1 2106 may not be able to generate a "clean" double tone as needed for receiver relative-phase synchronization. In such implementations, only a single tone is transmitted in the x'-magnetic field. Instead, at least one double tone signal is transmitted in the y'- and z'-magnetic field using the ordinary current source power amplifiers 1406 of the magnetic positioning transmitter (ref. FIG. 14). On the Receive-side 2150, L2 may be either short circuited by closing Q21 and Q23 or open-circuited, as shown in connection with FIG. 20.

Using the IPT bridge 1 2106 and the tuned IPT circuit 1 2108 including IPT coupler 1 for IPT and for generating the x'-magnetic field may considerably reduce overall system complexity and cost, but may require an external current sensor (I1) to close the control loop of the current drive circuit, as previously pointed out with respect to FIG. 20.

Figure 22:
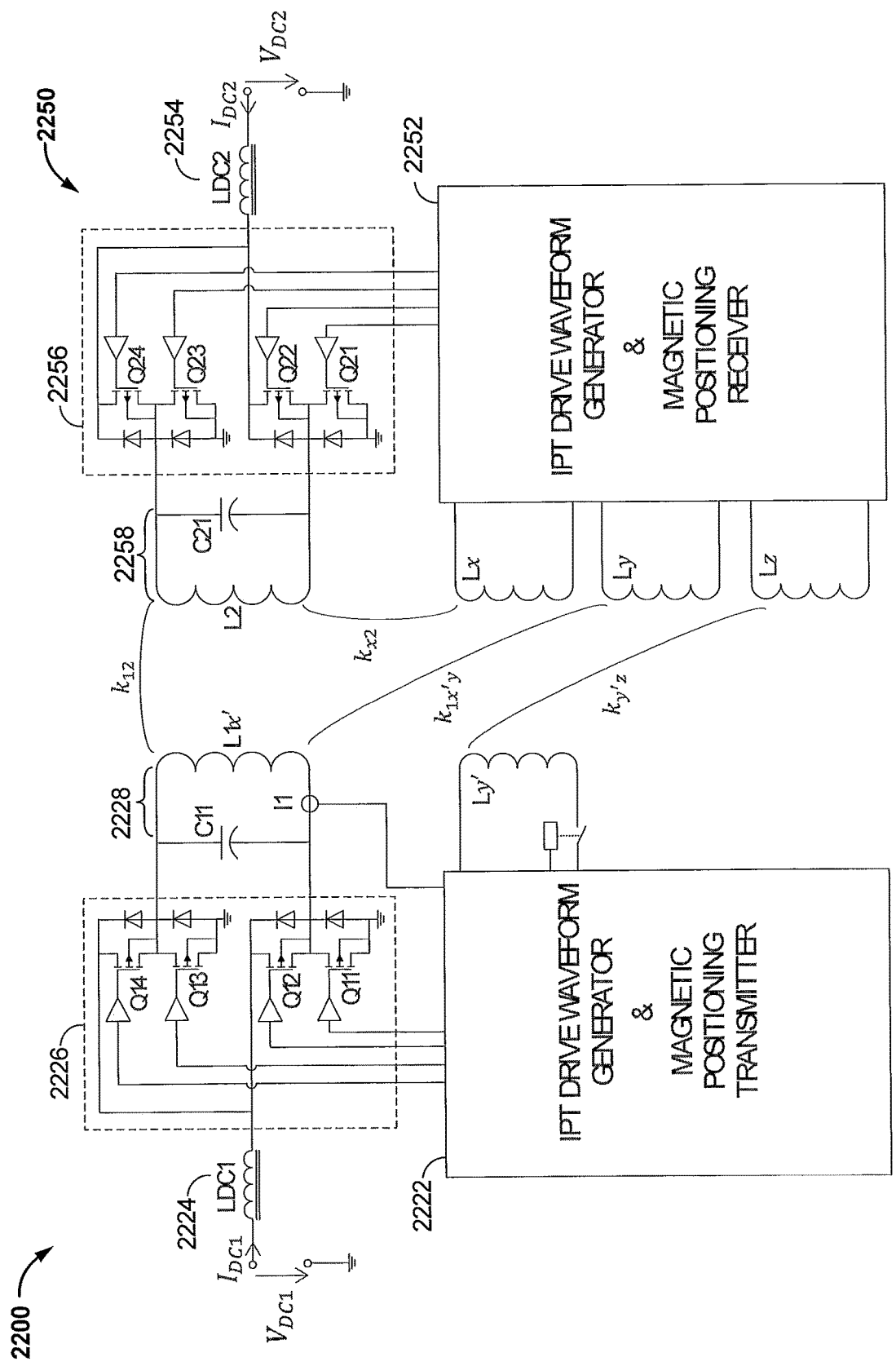
FIG. 22 shows a schematic diagram of a 2-axis generator/3-axis sensor magnetic positioning system integrated with a parallel-tuned IPT system, where the magnetic positioning system generates the x'-magnetic field using the IPT inverter, in accordance with some implementations.

A further reduction of system complexity may be achieved by applying the concept of FIG. 21 to a 2-axis generator/3-axis sensor positioning system as shown in FIG. 22, in accordance with some implementations. A 2-axis generator/3-axis sensor positioning system, omitting generation of the z'-magnetic field as shown by FIG. 22, may fulfill the requirements of a positioning system for stationary electric vehicle charging as previously discussed. In such implementations, the double tone required for receiver synchronization is transmitted in the y'-field generated by the magnetic positioning transmitter 2202 by driving the coil Ly' using an ordinary (linear) current driver, while a single tone is transmitted in the x'-magnetic field generated by the IPT subsystem 1 2200. On the receive-side, L2 may be either short circuited by closing Q21 and Q23, or open-circuited as shown in FIG. 20 for any of the previous implementations.

Figure 23:
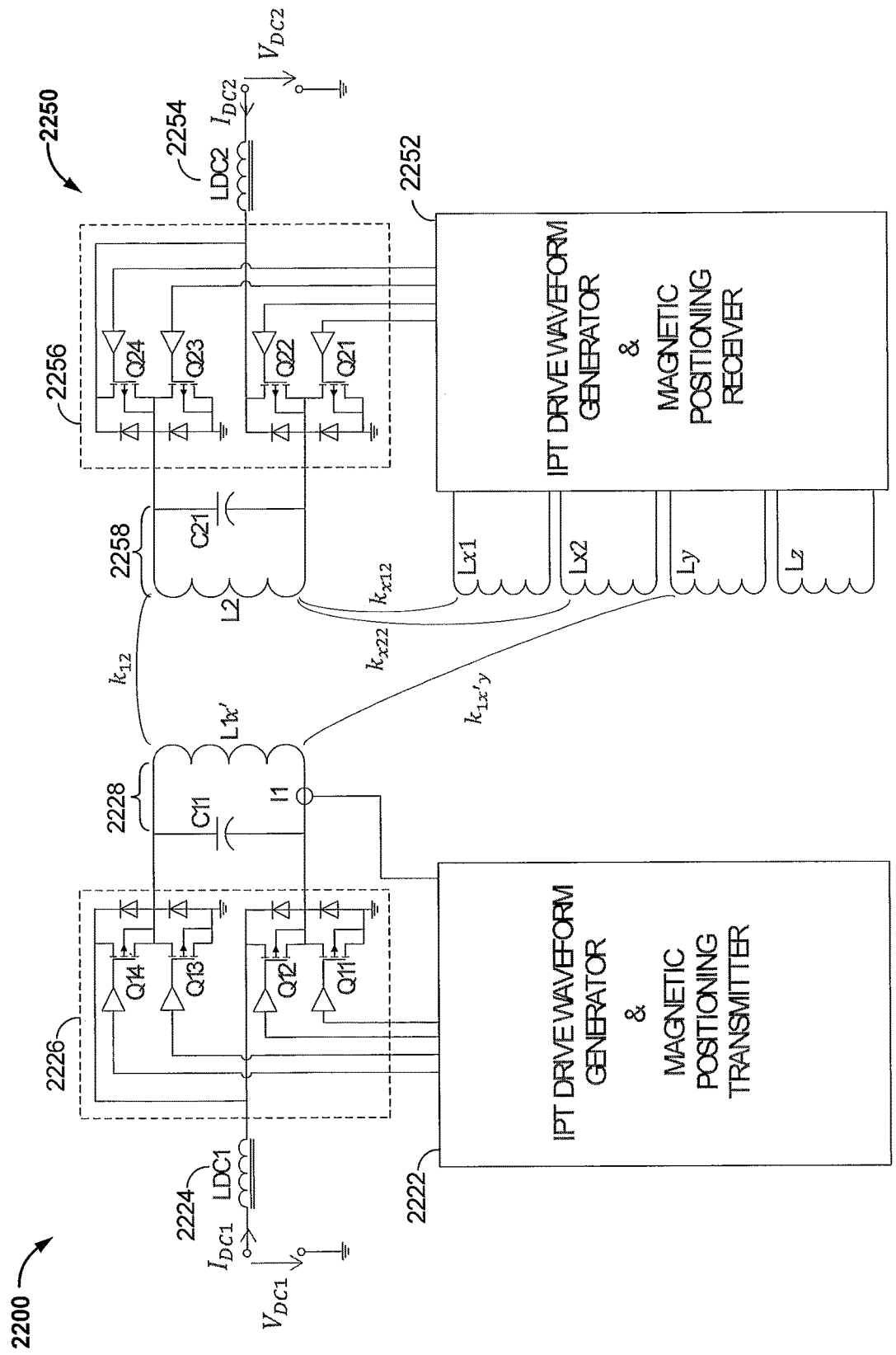
FIG. 23 shows a schematic diagram of a single-axis generator/3-axis sensor magnetic positioning system integrated with a parallel-tuned IPT system, where the magnetic positioning system generates the x'-magnetic field using the IPT inverter and senses the y-magnetic field component of the x'-magnetic field using two coils, in accordance with some implementations.

Yet a further reduction of system complexity may be achieved by applying the concept of FIG. 22 to a single-axis generator/3-axis sensor positioning system as shown in FIG. 23, in accordance with some implementations. A single-axis generator/3-axis sensor positioning system omitting the y'- and z'-magnetic field as shown by FIG. 23 may represent a compromise solution. This solution may not provide true position information but some sort of pseudo position information that may be useful for guidance and alignment.

This low complexity positioning system may not require receiver synchronization since only one (x'-) magnetic field (e.g. an x'-field) is transmitted, thus there is no need for transmitting a double tone. A single tone signal as generated by the IPT bridge 1 2226, and transmitted in the x'-magnetic field, may suffice for determining a pseudo position. However, on the receive-side 2250, this method may instead require two x-sense coils, designated by Lx1 and Lx2.

A sense coil arrangement in accordance with FIG. 13G may apply to the receive side 2250, which provides two coplanar x-coils (x1-coil 602a and x2-coil 602b) and two coaxial y-coils (y1-coil 604a and y2-coil 604b) and which may be connected in series to form one y-coil. Sense coils Lx1 and Lx2 may serve in a method for increasing a sensitivity of position by comparing the voltage received by Lx1 against the voltage received by Lx2 at locations where the y- and the z-component of the x'-magnetic field vanish and where the course of the x-component vs. x'-offset is flat, e.g., at positions close to the magnetic center of the generator coil $L_{1x'}$. This magnetic positioning system may require a receiver with a 4-channel AFE. A 4-channel AFE may be obtained by adding a supplementary AFE-channel to the receiver 3-channel AFE shown in FIG. 15.

Figure 24:
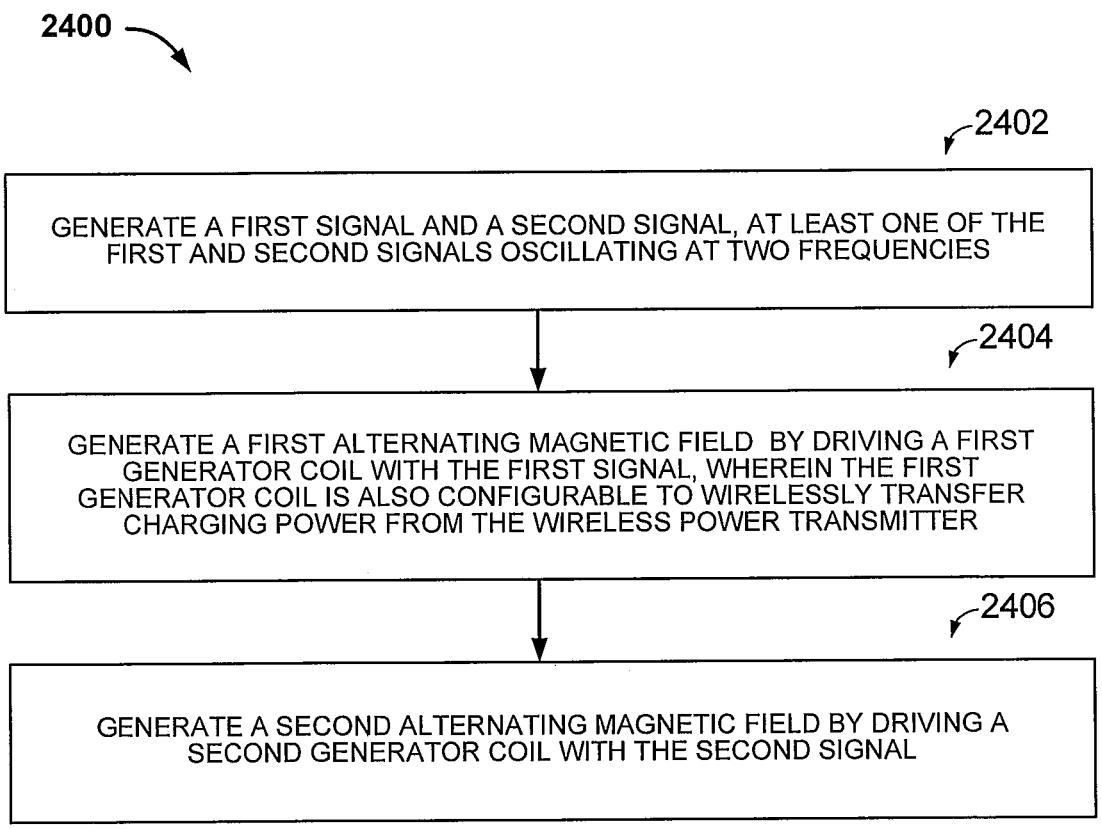
FIG. 24 is a flowchart depicting a method for determining a relative position between a wireless power transmitter and a wireless power receiver, in accordance with some implementations.

FIG. 24 is a flowchart 2400 depicting a method for determining a relative position of a wireless power transmitter from a wireless power receiver, in accordance with some implementations. The flowchart 2400 is described herein with reference to at least FIGS. 4A-23 and may correspond to a magnetic vectoring field generator. Although the flowchart 2400 is described herein with reference to a particular order, in various implementations, blocks herein may be performed in a different order, or omitted, and additional blocks may be added.

Block 2402 includes generating a first signal and a second signal, at least one of the first signal and the second signal oscillating at two frequencies. For example, as previously described in connection with any of FIGS. 11 and 19-23, the IPT drive waveform generator & magnetic positioning transmitter 1902, 2002, 2102, 2202, 2302 may be configured to generate a first signal (e.g., a first signal oscillating at frequencies $f_{x'_a}$ and $f_{x'_b}$) and a second signal (e.g., a second signal oscillating at frequency $f_{y'}$).

Block 2404 includes generating a first alternating magnetic field by driving a first generator coil with the first signal. The first generator coil is also configurable to wirelessly transfer charging power from the wireless power transmitter. For example, as previously described in connection with at least FIGS. 19-23, the IPT drive waveform generator & magnetic positioning transmitter 1902, 2002, 2102, 2202, 2302 may drive the IPT transmit coil $L_{1x'}$ with the first signal.

Block 2406 includes generating a second alternating magnetic field by driving a second generator coil with the second signal. For example, as previously described in connection with at least FIGS. 19-23, the IPT drive waveform generator & magnetic positioning transmitter 1902, 2002, 2102, 2202, 2302 may drive the one or both or the generator coils $L_{y'}$ and $L_{z'}$ with the second signal and a third signal, respectively.

Figure 25:
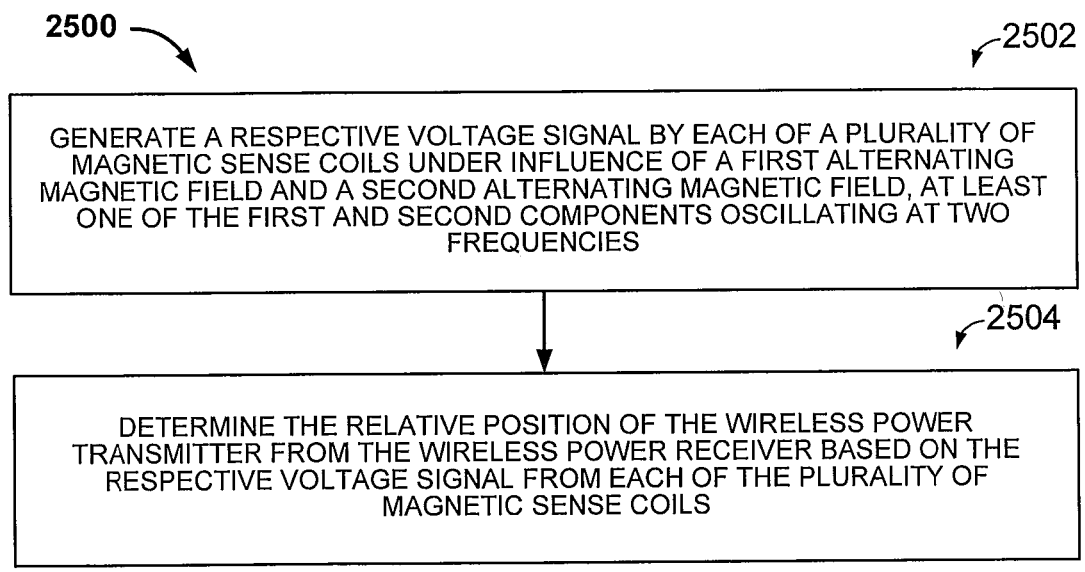
FIG. 25 is a flowchart depicting another method for determining a relative position between a wireless power transmitter and a wireless power receiver, in accordance with some implementations.

FIG. 25 is a flowchart 2500 depicting a method for determining a relative position of a wireless power transmitter from a wireless power receiver, in accordance with some implementations. The flowchart 2500 is described herein with reference to at least FIGS. 4-23 and may correspond to a magnetic vectoring field sensor. Although the flowchart 2500 is described herein with reference to a particular order, in various implementations, blocks herein may be performed in a different order, or omitted, and additional blocks may be added.

Block 2502 includes generating a respective voltage signal by each of a plurality of magnetic sense coils under influence of a first alternating magnetic field and a second alternating magnetic field. At least one of the first alternating magnetic field and the second alternating magnetic field oscillate at two frequencies. For example, as previously described in connection with any of FIGS. 11 and 16-23, each of the sensor coils $L_x$, $L_y$, $L_z$ may generate a respective voltage signal under influence of a first alternating magnetic field and a second alternating magnetic field. At least one of the first alternating magnetic field and the second alternating magnetic field oscillate at two frequencies (e.g., the first alternating magnetic field oscillates at frequencies $f_{x'a}$ and $f_{x'b}$ and the second alternating magnetic field oscillates at frequency $f_{y'}$).

Block 2504 includes determining the relative position of the wireless power transmitter from the wireless power receiver based on the respective voltage signal from each of the plurality of magnetic sense coils. For example, as previously described in connection with any of FIGS. 16-23, the relative position of the transmitter, embodied by the transmission side of any of FIGS. 16-23, may be determined based on the respective voltages induced within the sensor coils $L_x$, $L_y$, $L_z$.

The various operations of methods described above may be performed by any suitable means capable of performing the operations, such as various hardware and/or software component(s), circuits, and/or module(s). Generally, any operations illustrated in the FIGS. may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted as one or more instructions or code on a tangible, non-transitory, computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features have been described herein. It is to be understood that not necessarily all such advantages may be achieved in accordance with any particular implementation. Thus, one or more implementations achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for determining a relative position of a wireless power transmitter from a wireless power receiver, comprising:
   a driver circuit configured to generate a first signal oscillating at a first frequency and a second frequency separated from the first frequency by a first frequency spacing and a second signal oscillating at a third frequency that is separated from the second frequency by a second frequency spacing that is equal to the first frequency spacing;
   a first generator coil configured to generate a first alternating magnetic field oscillating at the first frequency and the second frequency when driven by the first signal;
   a second generator coil configured to generate a second alternating magnetic field oscillating at the third frequency when driven by the second signal, the first generator coil or the second generator coil also configurable to wirelessly transfer charging power from the wireless power transmitter; and a processor configured to determine the relative position of the wireless power transmitter based on signals derived from the first and second alternating magnetic fields.

2. The apparatus of claim 1, wherein the driver circuit is further configured to generate a third signal oscillating at one frequency, the apparatus further comprising a third generator coil configured to generate a third alternating magnetic field when driven by the third signal.

3. The apparatus of claim 2, wherein the frequencies of the first signal, the second signal and the third signal are different from one another and are separated from one another by a predetermined frequency separation.

4. The apparatus of claim 1, wherein the first signal oscillates at the first and second frequencies and the second signal oscillates at the third frequency and a fourth frequency.

5. The apparatus of claim 1, further comprising a coupling coil configured to inductively couple the first signal to the first generator coil.

6. A method for determining a relative position of a wireless power transmitter from a wireless power receiver, comprising:

generating a first signal oscillating at a first frequency and a second frequency separated from the first frequency by a first frequency spacing and a second signal oscillating at a third frequency that is separated from the second frequency by a second frequency spacing that is equal to the first frequency spacing;

generating a first alternating magnetic field oscillating at the first frequency and the second frequency by driving a first generator coil with the first signal;

generating a second alternating magnetic field by driving a second generator coil with the second signal oscillating at the third frequency, the first generator coil or the second generator coil also configurable to wirelessly transfer charging power from the wireless power transmitter; and determining the relative position of the wireless power transmitter based on signals derived from the first and second alternating magnetic fields.

7. The method of claim 6, further comprising generating a third alternating magnetic field by driving a third generator coil with a third signal oscillating at one frequency.

8. The method of claim 7, wherein the frequencies of the first signal, the second signal and the third signal are different from one another and are separated from one another by a predetermined frequency separation.

9. The method of claim 6, wherein the first signal oscillates at the first frequency and the second frequency and the second signal oscillates at the third frequency and a fourth frequency.

10. The method of claim 6, further comprising inductively coupling the first signal to the first generator coil by driving a coupling coil with the first signal.

11. An apparatus for determining a relative position of a wireless power transmitter from a wireless power receiver, comprising:

a plurality of magnetic sense coils, each configured to generate a respective voltage signal under influence of a first alternating magnetic field and a second alternating magnetic field, the first alternating magnetic field oscillating at a first frequency and a second frequency separated from the first frequency by a first frequency spacing and the second alternating magnetic field oscillating at a third frequency that is separated from the second frequency by a second frequency spacing that is equal to the first frequency spacing; and a processor configured to determine the relative position of the wireless power transmitter from the wireless power receiver based on the respective voltage signal from each of the plurality of magnetic sense coils.

12. The apparatus of claim 11, wherein the plurality of magnetic sense coils comprise at least a first magnetic sense coil oriented orthogonal to a second magnetic sense coil to provide at least a two-axis sensor.

13. The apparatus of claim 12, wherein the plurality of magnetic sense coils comprises a third magnetic sense coil oriented mutually orthogonally to the first magnetic sense coil and to the second magnetic sense coil.

14. The apparatus of claim 11, further comprising:
at least one receive coil configurable to inductively receive charging power; and
a circuit configured to short circuit the at least one receive coil in order to reduce an amount of mutual coupling with the at least one receive coil.

15. The apparatus of claim 11, wherein the first alternating magnetic field oscillates at the first and second frequencies and the second alternating magnetic field oscillates at the third frequency and a fourth frequency.

16. The apparatus of claim 11, the apparatus further comprising at least one receive coil configurable to inductively receive charging power, wherein one of the plurality of magnetic sense coils comprises a coupling coil configured to inductively couple with the at least one receive coil to generate the respective voltage signal under influence of the first alternating magnetic field and the second alternating magnetic field.

17. A method for determining a relative position of a wireless power transmitter from a wireless power receiver, comprising:

generating a respective voltage signal by each of a plurality of magnetic sense coils Under influence of a first alternating magnetic field oscillating at a first frequency and a second frequency separated from the first frequency by a first frequency spacing and a second alternating magnetic field oscillating at a third frequency that is separated from the second frequency by a second frequency spacing that is equal to the first frequency spacing; and determining the relative position of the wireless power transmitter from the wireless power receiver based on the respective voltage signal from each of the plurality of magnetic sense coils.

18. The method of claim 17, wherein the plurality of magnetic sense coils comprise at least a first magnetic sense coil oriented orthogonal to a second magnetic sense coil to provide at least a two-axis sensor.

19. The method of claim 18, wherein the plurality of magnetic sense coils comprises a third magnetic sense coil oriented mutually orthogonally to the first magnetic sense coil and to the second magnetic sense coil.

20. The method of claim 17, further comprising short circuiting at least one receive coil configurable to inductively receive charging power in order to reduce an amount of mutual coupling with the at least one receive coil.

21. The method of claim 17, wherein the first alternating magnetic field oscillates at the first and second frequencies and the second alternating magnetic field oscillates at the third frequency and a fourth frequency.

22. The method of claim 17, further comprising generating the respective voltage signal under influence of the first alternating magnetic field and the second alternating magnetic field by inductively coupling a coupling coil with at least one receive coil configurable to inductively receive charging power.

* * * * *